(12) United States Patent
Liu et al.

(10) Patent No.: US 11,631,688 B2
(45) Date of Patent: Apr. 18, 2023

(54) BONDED UNIFIED SEMICONDUCTOR CHIPS AND FABRICATION AND OPERATION METHODS THEREOF

(71) Applicant: YANGTZE MEMORY TECHNOLOGIES CO., LTD., Wuhan (CN)

(72) Inventors: Jun Liu, Wuhan (CN); Weihua Cheng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/540,224

(22) Filed: Dec. 1, 2021

(65) Prior Publication Data

US 2022/0093614 A1    Mar. 24, 2022

Related U.S. Application Data

(60) Division of application No. 16/565,481, filed on Sep. 9, 2019, now Pat. No. 11,302,706, which is a (Continued)

(30) Foreign Application Priority Data

Apr. 30, 2019 (WO) ................ PCT/CN2019/085237

(51) Int. Cl.
*H01L 27/11* (2006.01)
*H01L 27/1157* (2017.01)
(Continued)

(52) U.S. Cl.
CPC ...... *H01L 27/1157* (2013.01); *G11C 14/0018* (2013.01); *G11C 16/0483* (2013.01);
(Continued)

(58) Field of Classification Search
CPC ........... H01L 27/1157; H01L 21/02013; H01L 21/2007; H01L 21/50; H01L 21/76;
(Continued)

(56) References Cited

U.S. PATENT DOCUMENTS 6,055,655 A    4/2000 Momohara
10,283,493 B1    5/2019 Nishida
(Continued)

FOREIGN PATENT DOCUMENTS

CN    101253617 A    8/2008
CN    105097019 A    11/2015
(Continued)

OTHER PUBLICATIONS

Extended European Search Report issued in corresponding European Application No. 19927312, dated Sep. 16, 2022 10 pages.
(Continued)

*Primary Examiner* — Mohammad M Hoque
(74) *Attorney, Agent, or Firm* — Bayes PLLC

(57) ABSTRACT

Embodiments of bonded unified semiconductor chips and fabrication and operation methods thereof are disclosed. In an example, a method for forming a unified semiconductor chip is disclosed. A first semiconductor structure is formed. The first semiconductor structure includes one or more processors, an array of embedded DRAM cells, and a first bonding layer including a plurality of first bonding contacts. A second semiconductor structure is formed. The second semiconductor structure includes an array of NAND memory cells and a second bonding layer including a plurality of second bonding contacts. The first semiconductor structure and the second semiconductor structure are bonded in a face-to-face manner, such that the first bonding contacts are in contact with the second bonding contacts at a bonding interface.

20 Claims, 21 Drawing Sheets

Related U.S. Application Data continuation of application No. PCT/CN2019/097442, filed on Jul. 24, 2019.

(51) Int. Cl.

| | |
|---|---|
| *H01L 21/50* | (2006.01) |
| *H01L 23/00* | (2006.01) |
| *H01L 27/06* | (2006.01) |
| *H01L 27/108* | (2006.01) |
| *H01L 27/11578* | (2017.01) |
| *G11C 14/00* | (2006.01) |
| *G11C 16/04* | (2006.01) |
| *H01L 25/18* | (2023.01) |
| *H01L 25/00* | (2006.01) |
| *H01L 27/11526* | (2017.01) |
| *H01L 27/11556* | (2017.01) |
| *H01L 27/11573* | (2017.01) |
| *H01L 27/11582* | (2017.01) |
| *H01L 29/04* | (2006.01) |
| *H01L 29/16* | (2006.01) |
| *H01L 21/02* | (2006.01) |
| *H01L 21/20* | (2006.01) |
| *H01L 21/76* | (2006.01) |
| *H01L 21/822* | (2006.01) |
| *H01L 25/065* | (2023.01) |

(52) U.S. Cl.
CPC .... *H01L 21/02013* (2013.01); *H01L 21/2007* (2013.01); *H01L 21/50* (2013.01); *H01L 21/76* (2013.01); *H01L 21/8221* (2013.01); *H01L 24/03* (2013.01); *H01L 24/05* (2013.01); *H01L 24/06* (2013.01); *H01L 24/08* (2013.01); *H01L 24/27* (2013.01); *H01L 24/29* (2013.01); *H01L 24/32* (2013.01); *H01L 24/73* (2013.01); *H01L 24/83* (2013.01); *H01L 24/94* (2013.01); *H01L 25/0657* (2013.01); *H01L 25/18* (2013.01); *H01L 25/50* (2013.01); *H01L 27/0688* (2013.01); *H01L 27/10808* (2013.01); *H01L 27/10847* (2013.01); *H01L 27/10852* (2013.01); *H01L 27/10873* (2013.01); *H01L 27/10894* (2013.01); *H01L 27/10897* (2013.01); *H01L 27/1104* (2013.01); *H01L 27/11526* (2013.01); *H01L 27/11556* (2013.01); *H01L 27/11573* (2013.01); *H01L 27/11578* (2013.01); *H01L 27/11582* (2013.01); *H01L 29/04* (2013.01); *H01L 29/16* (2013.01); *H01L 2224/04042* (2013.01); *H01L 2224/05569* (2013.01); *H01L 2224/08145* (2013.01); *H01L 2224/291* (2013.01); *H01L 2224/32145* (2013.01); *H01L 2224/73215* (2013.01); *H01L 2224/80895* (2013.01); *H01L 2224/80896* (2013.01); *H01L 2224/83895* (2013.01); *H01L 2224/83896* (2013.01)

(58) Field of Classification Search
CPC ..... H01L 21/8221; H01L 24/03; H01L 24/05; H01L 24/06; H01L 24/08; H01L 24/27; H01L 24/29; H01L 24/32; H01L 24/73; H01L 24/83; H01L 24/94; H01L 25/0657; H01L 25/18; H01L 2224/32145; H01L 2224/73215; H01L 2224/80895; H01L 2224/80896; H01L 2224/83895; H01L 2224/83896; H01L 2224/80048; H01L 2224/80894; H01L 21/185; H01L 27/1116; H01L 27/2436; H01L 27/2481; H01L 45/06; H01L 2224/05599; H01L 2224/05624; H01L 2224/05644; H01L 2224/05647; H01L 2224/05657; H01L 2224/05684; H01L 2224/29186; H01L 2224/80357; H01L 2224/94; H01L 2225/06524; H01L 2225/06541; H01L 24/80; H01L 2225/06565; H01L 23/3114; H01L 2225/06513; H01L 25/16; H01L 24/26; H01L 27/11; H01L 27/11524; H01L 27/11551; H01L 45/16; G11C 14/0018; G11C 16/0483; G11C 2213/71; G11C 11/5621; G11C 11/5678; G11C 13/0004; G11C 11/005; G11C 11/401
USPC .......................................................... 257/314
See application file for complete search history.

(56) References Cited

U.S. PATENT DOCUMENTS

| | | |
|---|---|---|
| 10,811,071 B1 | 10/2020 | Li et al. |
| 2005/0274952 A1 | 12/2005 | Yamazaki et al. |
| 2008/0001271 A1 | 1/2008 | Marcinkiewicz |
| 2009/0302484 A1 | 12/2009 | Lee et al. |
| 2013/0280861 A1 | 10/2013 | Ma et al. |
| 2015/0340366 A1 | 11/2015 | Lim et al. |
| 2017/0092680 A1 | 3/2017 | Kwon |
| 2018/0204820 A1* | 7/2018 | Zhai ................... H01L 23/3135 |
| 2019/0006339 A1 | 1/2019 | Lau et al. |
| 2019/0081069 A1 | 3/2019 | Lu et al. |
| 2019/0123024 A1 | 4/2019 | Teig et al. |
| 2019/0348394 A1 | 11/2019 | Nakano |
| 2020/0350014 A1 | 11/2020 | Liu |
| 2020/0350320 A1 | 11/2020 | Cheng et al. |

FOREIGN PATENT DOCUMENTS

| | | |
|---|---|---|
| CN | 109148498 A | 1/2019 |
| CN | 109155301 A | 1/2019 |
| KR | 201501334494 | 12/2015 |
| TW | 201913966 A | 4/2019 |
| TW | 201916323 A | 4/2019 |
| WO | 2008096802 A1 | 8/2008 |

OTHER PUBLICATIONS

International Search Report issued in corresponding International Application No. PCT/2019/097442, dated Feb. 3, 2020, 4 pages.
Written Opinion of the International Searching Authority issued in corresponding International Application No. PCT/2019/097442, dated Feb. 3, 2020, 4 pages.

* cited by examiner

200

| WL DRIVER 202 | WI-FI CNTLR 220 | | PAGE BUFFER 204 | |
|---|---|---|---|---|
| | APPLICATION PROCESSOR 208 | BLUETOOTH CNTLR 218 | | DSP 212 |
| | | GPS CNTLR 222 | | |
| DISP CNTLR 214 | EMBEDDED DRAM 206 | BASEBAND PROCESSOR 210 | | WL DRIVER 202 |
| | PAGE BUFFER 204 | POWER CNTRL 216 | | |

FIG. 2

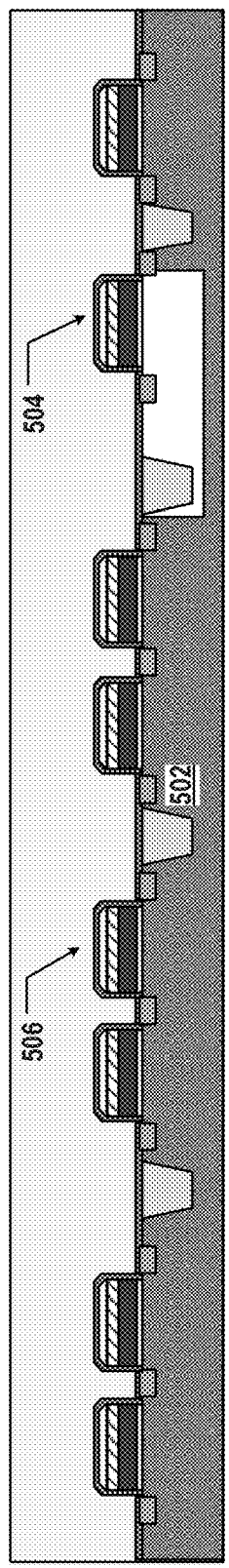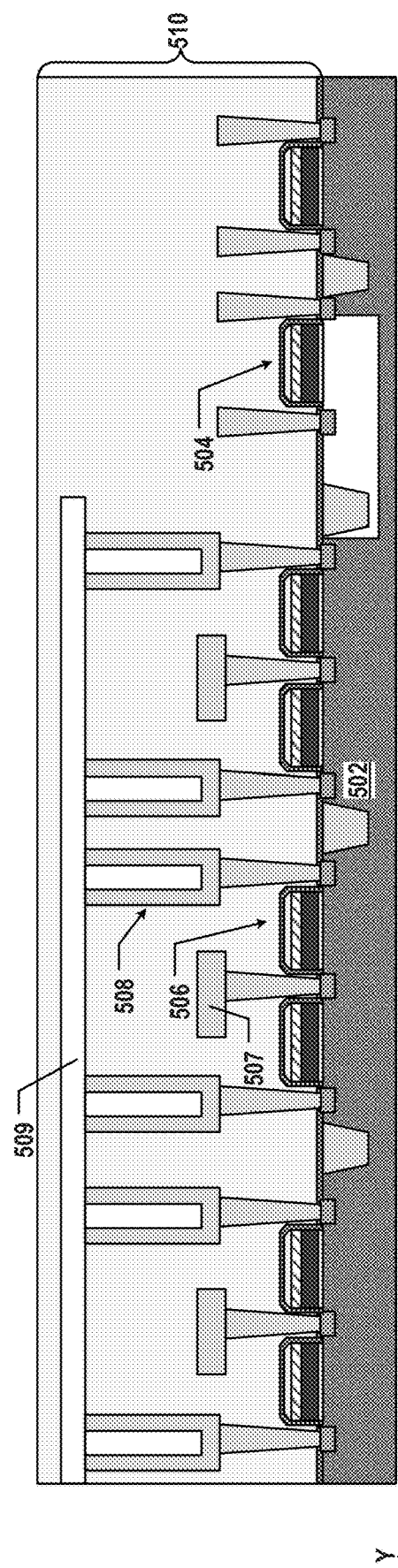
FIG. 5A
FIG. 5B

BONDED UNIFIED SEMICONDUCTOR CHIPS AND FABRICATION AND OPERATION METHODS THEREOF

CROSS-REFERENCE TO RELATED APPLICATIONS

This application is a division of U.S. application Ser. No. 16/565,481, filed on Sep. 9, 2019, entitled "BONDED UNIFIED SEMICONDUCTOR CHIPS AND FABRICATION AND OPERATION METHODS THEREOF," which is a continuation of International Application No. PCT/CN2019/097442, filed on Jul. 24, 2019, entitled "BONDED UNIFIED SEMICONDUCTOR CHIPS AND FABRICATION AND OPERATION METHODS THEREOF," which claims the benefit of priority to International Application No. PCT/CN2019/085237, filed on Apr. 30, 2019, entitled "THREE-DIMENSIONAL MEMORY DEVICE WITH EMBEDDED DYNAMIC RANDOM-ACCESS MEMORY," all of which are incorporated herein by reference in their entireties.

BACKGROUND

Embodiments of the present disclosure relate to semiconductor devices and fabrication and operation methods thereof.

In modern mobile devices (e.g., smartphones, tablets, etc.), multiple complicated system-on-chips (SOC) are used to enable various functionalities, such as application processor, dynamic random-access memory (DRAM), Flash memory, various controllers for Bluetooth, Wi-Fi, global positioning system (GPS), frequency modulation (FM) radio, display, etc., and baseband processor, which are formed as discrete chips. For example, application processor typically is large in size including central processing units (CPUs), graphics processing units (GPUs), on-chip memory, accelerating function hardware, and other analog components.

SUMMARY

Embodiments of bonded unified semiconductor chips and fabrication and operation methods thereof are disclosed herein.

In one example, a unified semiconductor chip includes a first semiconductor structure including one or more processors, an array of embedded DRAM cells, and a first bonding layer including a plurality of first bonding contacts. The unified semiconductor chip also includes a second semiconductor structure including an array of NAND memory cells and a second bonding layer including a plurality of second bonding contacts. The unified semiconductor chip further includes a bonding interface between the first bonding layer and the second bonding layer. The first bonding contacts are in contact with the second bonding contacts at the bonding interface.

In another example, a method for forming a unified semiconductor chip is disclosed. A first semiconductor structure is formed. The first semiconductor structure includes one or more processors, an array of embedded DRAM cells, and a first bonding layer including a plurality of first bonding contacts. A second semiconductor structure is formed. The second semiconductor structure includes an array of NAND memory cells and a second bonding layer including a plurality of second bonding contacts. The first semiconductor structure and the second semiconductor structure are bonded in a face-to-face manner, such that the first bonding contacts are in contact with the second bonding contacts at a bonding interface.

In still another example, a method for operating a unified semiconductor chip is disclosed. The unified semiconductor chip includes one or more processors, an array of embedded DRAM cells, and an array of NAND memory cells in a same bonded chip. Data is transferred from the one or more processors to the array of embedded DRAM cells. The data is buffered in the array of embedded DRAM cells. The data is stored in the array of NAND memory cells from the array of embedded DRAM cells.

In yet another example, a mobile device includes a display, one or more transceivers, and a unified semiconductor chip operatively coupled the display and the one or more transceivers. The unified semiconductor chip includes a first semiconductor structure including an application processor, a baseband processor, an array of embedded DRAM cells, and a first bonding layer including a plurality of first bonding contacts. The unified semiconductor chip also includes a second semiconductor structure including an array of NAND memory cells and a second bonding layer including a plurality of second bonding contacts. The unified semiconductor chip further includes a bonding interface between the first bonding layer and the second bonding layer. The first bonding contacts are in contact with the second bonding contacts at the bonding interface. The application processor is configured to generate data to be presented by the display. The baseband processor is configured to process data received by at least one of the one or more transceivers and data to be transmitted by the at least one transceiver.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 2 illustrates a schematic plan view of an exemplary semiconductor structure having processors, controllers, and an embedded DRAM, according to some embodiments.

FIGS. 5A-5C illustrate a fabrication process for forming an exemplary semiconductor structure having one or more processors and an embedded DRAM, according to some embodiments.

Figure 1A:
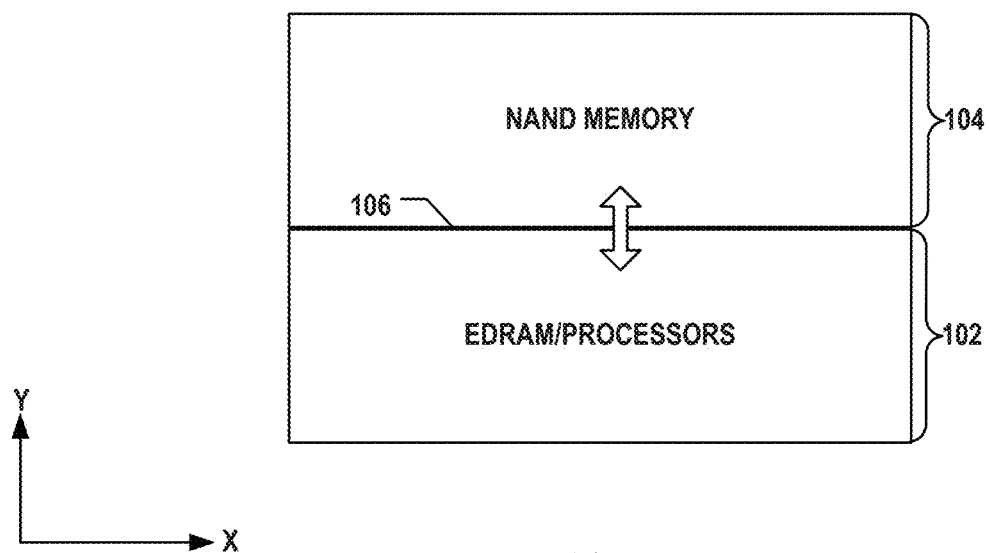
FIG. 1A illustrates a schematic view of a cross-section of an exemplary unified semiconductor chip, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

In existing smartphones (and other mobile devices), the application processor and memory (e.g., DRAM and NAND) are placed on the PCB separately communicating through long and slow interlink on the PCB. Data throughput suffers as a result. Also, the size of the PCB is large because of area consumption from the separate application processor and DRAM and NAND memory chips, limiting room available for the battery and other discrete components in the smartphone. Moreover, the application processor has on-chip memory, which further increases its chip size.

Various embodiments in accordance with the present disclosure provide a unified semiconductor chip having one or more processors (e.g., application processor and baseband processor) and volatile and non-volatile memory (e.g., embedded DRAM and NAND memory), with improved bidirectional data transfer throughput between the processing units and data storage as well as between volatile and non-volatile memory, thereby achieving overall faster system speed, while reducing PCB footprint at the same time. In some embodiments, the peripheral circuit of the memory is formed on the same substrate with the processing units (e.g., processors and controllers). In some embodiments, embedded DRAM is also formed on the same substrate with the processing units as a high-speed memory buffer to eliminate on-chip memory and reduce chip size. The NAND memory cell array (either 2D or 3D) can be formed on another substrate and then bonded to the substrate on which the processors are formed. In one example, the unified semiconductor chip disclosed herein can enable an instant-on feature on mobile devices (e.g., smartphones) to save power consumption because of its high-speed non-volatile data storage capability.

FIG. 1A illustrates a schematic view of a cross-section of an exemplary unified semiconductor chip 100, according to some embodiments. Unified semiconductor chip 100 represents an example of a bonded chip. The components of unified semiconductor chip 100 (e.g., processors/embedded DRAM and NAND memory) can be formed separately on different substrates and then jointed to form a bonded chip. Unified semiconductor chip 100 can include a first semiconductor structure 102 including one or more processors and an array of embedded DRAM cells. In some embodiments, the processors and embedded DRAM cell array in first semiconductor structure 102 use complementary metal-oxide-semiconductor (CMOS) technology. Both the processors and the embedded DRAM cell array can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.) to achieve high speed.

The processors can include specialized processors including, but not limited to, CPU, GPU, digital signal processor (DSP), tensor processing unit (TPU), vision processing unit (VPU), neural processing unit (NPU), synergistic processing unit (SPU), physics processing unit (PPU), and image signal processor (ISP). The processors can also include SoCs that combine multiple specialized processors, such as application processors, baseband processors, and so on. In some embodiments in which unified semiconductor chip 100 is used in mobile devices (e.g., smartphones, tablets, eyeglasses, wrist watches, virtual reality/augmented reality headsets, laptop computers, etc.), an application processor handles applications running in an operating system environment, and a baseband processor handles the cellular communications, such as the second generation (2G), the third generation (3G), the fourth generation (4G), the fifth generation (5G), the sixth generation (6G) cellular communications, and so on.

Other processing units besides processors can be formed in first semiconductor structure 102 as well, such as one or more controllers and the peripheral circuit of the NAND memory. A controller can handle a specific operation in an embedded system. In some embodiments in which unified semiconductor chip 100 is used in mobile devices, each controller can handle a specific operation of the mobile device, for example, communications other than cellular communication (e.g., Bluetooth communication, Wi-Fi communication, FM radio, etc.), power management, display drive, positioning and navigation, touch screen, camera, etc. First semiconductor structure 102 of unified semiconductor chip 100 thus can further include a Bluetooth controller, a Wi-Fi controller, a FM radio controller, a power controller, a display controller, a GPS controller, a touch screen controller, a camera controller, to name a few, each of which is configured to control operations of the corresponding component in a mobile device.

In some embodiments, first semiconductor structure 102 of unified semiconductor chip 100 further includes the peripheral circuit of the NAND memory. The peripheral circuit (also known as control and sensing circuits) can include any suitable digital, analog, and/or mixed-signal circuits used for facilitating the operations of the NAND memory. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

An embedded DRAM is a DRAM integrated on the same substrate of logic circuits (e.g., the processors), which allows wider bus and higher operation speed. Embedded DRAM, like all types of DRAM, requires periodic refreshing of the memory cells. The memory controller for refreshing the embedded DRAM can be embedded as another example of the controllers described above. In some embodiments, each embedded DRAM cell includes a capacitor for storing a bit of data as a positive or negative electrical charge as well as one or more transistors that control access to it. In one example, each embedded DRAM cell is a one-transistor, one-capacitor (1T1C) cell.

Unified semiconductor chip 100 can also include a second semiconductor structure 104 including an array of NAND memory cells. That is, second semiconductor structure 104 can be a NAND Flash memory device in which memory cells are provided in the form of an array of 3D NAND memory strings and/or an array of 2D NAND memory cells. NAND memory cells can be organized into pages which are then organized into blocks in which each NAND memory cell is electrically connected to a separate line called a bit line (BL). All cells with the same vertical position in the NAND memory cell can be electrically connected through the control gates by a word line (WL). In some embodiments, a plane contains a certain number of blocks that are electrically connected through the same bit line. Second semiconductor structure 104 can include one or more planes, and the peripheral circuit that is needed to perform all the read/write/erase operations can be included in first semiconductor structure 102 as described above.

In some embodiments, the array of NAND memory cells are an array of 2D NAND memory cells, each of which includes a floating-gate transistor. The array of 2D NAND memory cells include a plurality of 2D NAND memory strings, each of which includes a plurality of memory cells (e.g., 32 to 128 memory cells) connected in series (resembling a NAND gate) and two select transistors, according to some embodiments. Each 2D NAND memory string is arranged in the same plane on the substrate (in 2D), according to some embodiments. In some embodiments, the array of NAND memory cells are an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor.

As shown in FIG. 1A, unified semiconductor chip 100 further includes a bonding interface 106 vertically between first semiconductor structure 102 and second semiconductor structure 104. As described below in detail, first and second semiconductor structures 102 and 104 can be fabricated separately (and in parallel in some embodiments) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance electrical connections between first semiconductor structure 102 and second semiconductor structure 104, as opposed to the long-distance chip-to-chip data bus on the circuit board (e.g., PCB), thereby eliminating chip interface delay and achieving high-speed I/O throughput with reduced power consumption. Data transfer between the NAND memory in second semiconductor structure 104 and the embedded DRAM in first semiconductor structure 102 as well as between the NAND memory in second semiconductor structure 104 and the processors in first semiconductor structure 102 can be performed through the interconnects (e.g., bonding contacts) across bonding interface 106. By vertically integrating first and second semiconductor structures 102 and 104, the chip size can be reduced, and the memory cell density can be increased. Furthermore, as a "unified" chip, by integrating multiple discrete chips (e.g., various processors, controllers and memories) into a single bonded chip (e.g., unified semiconductor chip 100), faster system speed and smaller PCB size can be achieved as well. For example, all or most of the functional components of a mobile device may be integrated into unified semiconductor chip 100 to enable "mobile device-on-a-chip."

Figure 1B:
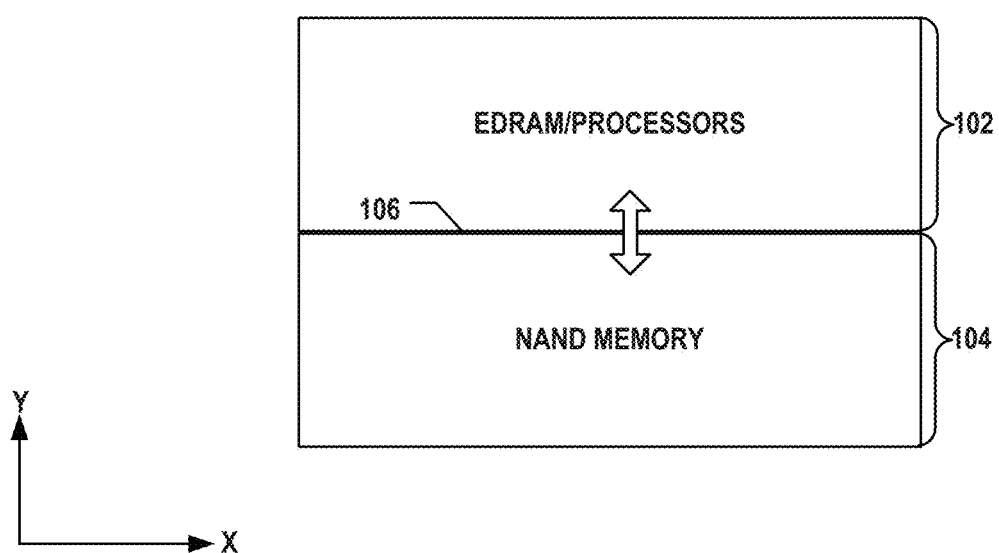
FIG. 1B illustrates a schematic view of a cross-section of another exemplary unified semiconductor chip, according to some embodiments.

It is understood that the relative positions of stacked first and second semiconductor structures 102 and 104 are not limited. FIG. 1B illustrates a schematic view of a cross-section of another exemplary unified semiconductor chip 101, according to some embodiments. Being different from unified semiconductor chip 100 in FIG. 1A in which second semiconductor structure 104 including the array of NAND memory cells is above first semiconductor structure 102 including the processors and the array of embedded DRAM cells, in unified semiconductor chip 101 in FIG. 1B, first semiconductor structure 102 including the processors and the array of embedded DRAM cells is above second semiconductor structure 104 including the array of NAND memory cells. Nevertheless, bonding interface 106 is formed vertically between first and second semiconductor structures 102 and 104 in unified semiconductor chip 101, and first and second semiconductor structures 102 and 104 are joined vertically through bonding (e.g., hybrid bonding) according to some embodiments. Data transfer between the NAND memory in second semiconductor structure 104 and the embedded DRAM in first semiconductor structure 102 as well as the data transfer between NAND memory in second semiconductor structure 104 and the processors in first semiconductor structure 102 can be performed through the interconnects (e.g., bonding contacts) across bonding interface 106.

FIG. 2 illustrates a schematic plan view of an exemplary semiconductor structure 200 having processors, controllers, and an embedded DRAM, according to some embodiments. Semiconductor structure 200 may be one example of first semiconductor structure 102. Semiconductor structure 200 can include the peripheral controlling circuit and sensing NAND memory, including word line drivers 202, page buffers 204, and any other suitable devices. Semiconductor structure 200 can further include embedded DRAM 206 on the same substrate as the peripheral circuit and fabricated using the same logic processes as the peripheral circuit. FIG. 2 shows an exemplary layout of the peripheral circuit (e.g., word line drivers 202, page buffers 204) and embedded DRAM 206 in which peripheral circuit (e.g., word line drivers 202, page buffers 204) and embedded DRAM 206 are formed in different regions on the same plane. For example, embedded DRAM 206 may be formed outside of the peripheral circuit (e.g., word line drivers 202, page buffers 204).

Semiconductor structure 200 can also include multiple processors on the same substrate as the peripheral circuit and embedded DRAM 206 and fabricated using the same logic process as the peripheral circuit and embedded DRAM 206. In the exemplary layout shown in FIG. 2, the processors can include an application processor 208, a baseband processor 210, and a DSP 212. In some embodiments, application processor 208 includes, for example, one or more CPUs, GPUs, cache, connectivities, interfaces (I/Fs), audio, and security modules. In some embodiments, baseband processor 210 includes, for example, filters, power amplifiers, analog-to-digital converters (ADCs), digital-to-analog converters (DACs), and modem. DSP 212 is a specialized processor that is optimized for operational needs of digital signal processing, such as measuring, filtering, or compressing continuous analog signals, according to some embodiments.

Semiconductor structure 200 can further include multiple controllers (also known as microcontroller units "MCUs") on the same substrate as the peripheral circuit and embedded DRAM 206 and fabricated using the same logic processes as the peripheral circuit and embedded DRAM 206. In the exemplary layout shown in FIG. 2, the controllers can include a display controller 214, a power controller 216, various communication controllers, such as a Bluetooth controller 218 and a Wi-Fi controller 220, and a GPS controller 222. Each controller 214, 216, 218, 220, and/or 222 is configured to control operations of the corresponding component. For example, display controller 214 may receive display data generated by application processor 208 (e.g., by its GPU) and provide control signals (e.g., scan signals, frame data, timing signals, etc.) to drive the display. In another example, power controller 216 (also known as power management unit "PMU") may control power-related operations, such as monitoring power connections and battery charges, charging the battery, regulating the power to other components, and managing power consumption. In still another example, each communication controller 218 or 220 may control the corresponding transceiver to transmit and receive wireless signals based on the corresponding communication standards and protocols, e.g., Bluetooth 3.x, Bluetooth 4.x, Bluetooth Lower Energy (BLE), Bluetooth 5.x, Wi-Fi 4, Wi-Fi 5, Wi-Fi 6, etc. In yet another example, GPS controller 222 may control the global navigation transceiver to transmit and receive signals for positioning and navigation using GPS, GLObal NAvigation Satellite System (GLONASS), Galileo, or BeiDou system.

It is understood that the layout of semiconductor structure 200 is not limited to the exemplary layout in FIG. 2. In some embodiments, at least some of the peripheral circuit (e.g., word line drivers 202, page buffers 204), the processors (e.g., application processor 208, baseband processor 210, DSP 212), the controllers (e.g., display controller 214, power controller 216, Bluetooth controller 218, Wi-Fi controller 220, GPS controller 222), and embedded DRAM 206 (e.g., the array of embedded DRAM cells) are stacked one over another, i.e., in different planes. For example, embedded DRAM 206 (e.g., the array of embedded DRAM cells) may be formed above or below the peripheral circuit and the processors to further reduce the chip size.

Figure 3A:
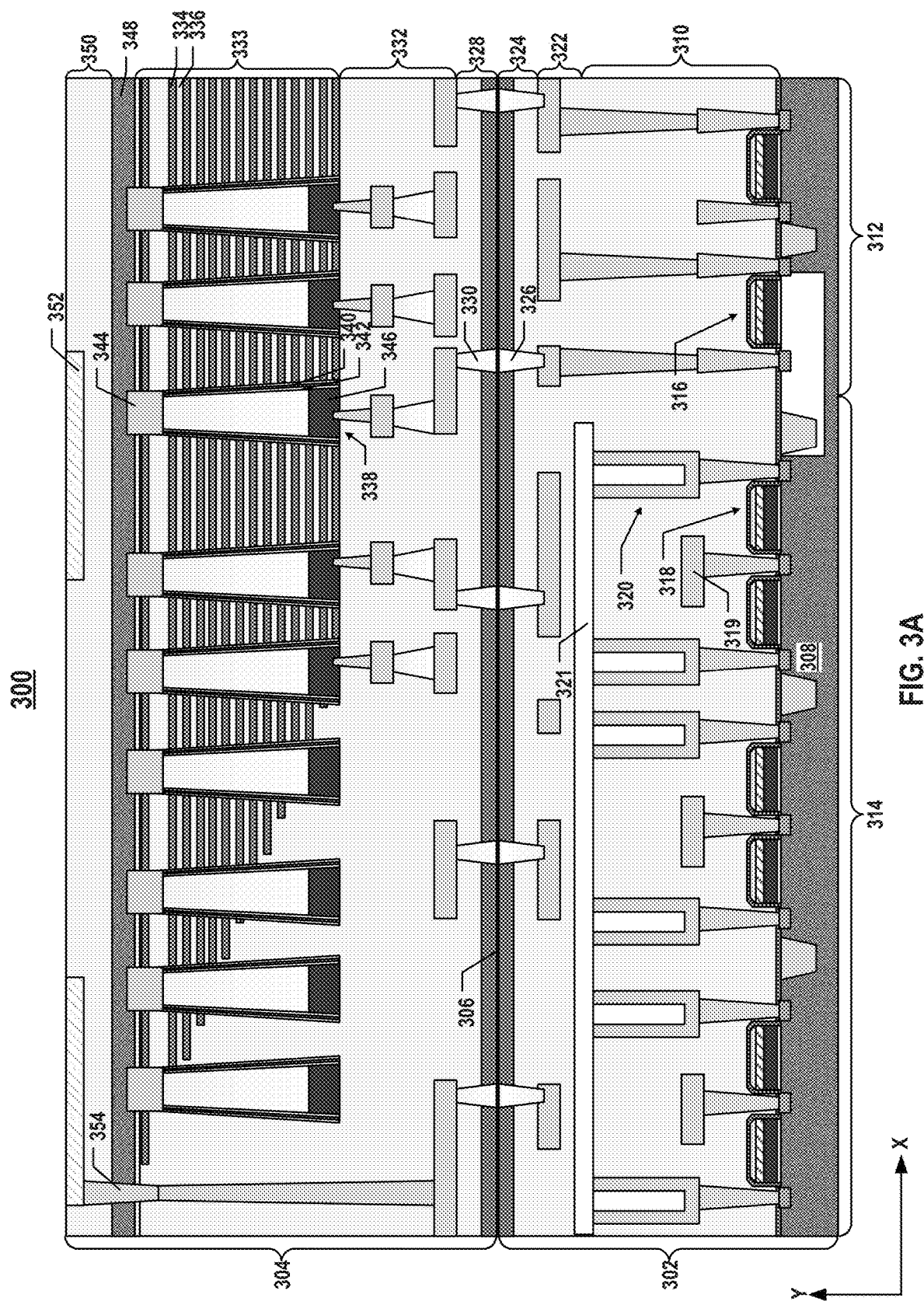
FIG. 3A illustrates a cross-section of an exemplary unified semiconductor chip having three-dimensional (3D) NAND memory, according to some embodiments.

FIG. 3A illustrates a cross-section of an exemplary unified semiconductor chip 300 having 3D NAND memory, according to some embodiments. As one example of unified semiconductor chip 100 described above with respect to FIG. 1A, unified semiconductor chip 300 is a bonded chip including a first semiconductor structure 302 and a second semiconductor structure 304 stacked over first semiconductor structure 302. First and second semiconductor structures 302 and 304 are jointed at a bonding interface 306 therebetween, according to some embodiments. As shown in FIG. 3A, first semiconductor structure 302 can include a substrate 308, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 302 of unified semiconductor chip 300 can include a device layer 310 above substrate 308. It is noted that x- and y-axes are added in FIG. 3A to further illustrate the spatial relationship of the components in unified semiconductor chip 300. Substrate 308 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., unified semiconductor chip 300) is determined relative to the substrate of the semiconductor device (e.g., substrate 308) in the y-direction (the vertical direction or thickness direction) when the substrate is positioned in the lowest plane of the semiconductor device in the y-direction. The same notion for describing the spatial relationship is applied throughout the present disclosure.

In some embodiments, device layer 310 includes one or more processors 312 on substrate 308 and an array of embedded DRAM cells 314 on substrate 308 and outside of processors 312. In some embodiments, processors 312 include a plurality of logic transistors 316 forming any suitable specialized processors and/or SoCs as described above in detail, such as an application processor (e.g., including one or more CPUs and GPUs) and a baseband processor. In some embodiments, logic transistors 316 also form any suitable controllers as described above in detail, such as a display controller, a power controller, a GPS controller, and one or more communication controllers (e.g., Bluetooth controller, Wi-Fi controller). In some embodiments, logic transistors 316 further form a peripheral circuit, i.e., any suitable digital, analog, and/or mixed-signal control and sensing circuits used for facilitating the operation of the 3D NAND memory including, but not limited to, a page buffer, a decoder (e.g., a row decoder and a column decoder), a sense amplifier, a driver (e.g., a word line driver), a charge pump, a current or voltage reference. That is, device layer 310 can include one or more controllers and/or the peripheral circuit of the 3D NAND memory on substrate 308 as well.

Logic transistors 316 can be formed "on" substrate 308, in which the entirety or part of logic transistors 316 are formed in substrate 308 (e.g., below the top surface of substrate 308) and/or directly on substrate 308. Isolation regions (e.g., shallow trench isolations (STIs)) and doped regions (e.g., source regions and drain regions of logic transistors 316) can be formed in substrate 308 as well. Logic transistors 316 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, each embedded DRAM cell 314 includes a DRAM selection transistor 318 and a capacitor 320. Embedded DRAM cell 314 can be a 1T1C cell consisting of one transistor and one capacitor. It is understood that embedded DRAM cell 314 may be of any suitable configurations, such as 2T1C cell, 3T1C cell, etc. In some embodiments, DRAM selection transistors 318 are formed "on" substrate 308, in which the entirety or part of DRAM selection transistors 318 are formed in substrate 308 (e.g., below the top surface of substrate 308) and/or directly on substrate 308. Isolation regions (e.g., STIs) and doped regions (e.g., source regions and drain regions of DRAM selection transistors 318) can be formed in substrate 308 as well. As shown in FIG. 3A, DRAM selection transistors 318 and logic transistors 316 can be formed in different regions on the same plane, e.g., on substrate 308. That is, DRAM selection transistors 318 can be formed outside of the region in which processors 312 are formed on substrate 308. In some embodiments, capacitors 320 are formed above DRAM selection transistors 318. Each capacitor 320 includes two electrodes, one of which is electrically connected to one node of respective DRAM selection transistor 318, according to some embodiments. Another node of each DRAM selection transistor 318 is electrically connected to a bit line 319 of embedded DRAM, according to some embodiments. Another electrode of each capacitor 320 can be electrically connected to a common plate 321, e.g., a common ground. It is understood that the structure and configuration of embedded DRAM cell 314 are not limited to the example in FIG. 3A and may include any suitable structure and configuration. For example, capacitor 320 may be a planar capacitor, a stack capacitor, a multi-fins capacitor, a cylinder capacitor, a trench capacitor, or a substrate-plate capacitor.

In some embodiments, first semiconductor structure 302 of unified semiconductor chip 300 further includes an interconnect layer 322 above device layer 310 to transfer electrical signals to and from processors 312 and array of embedded DRAM cells 314. Interconnect layer 322 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 322 can further include one or more interlayer dielectric (ILD) layers (also known as "intermetal dielectric (IMD) layers") in which the interconnect lines and via contacts can form. That is, interconnect layer 322 can include interconnect lines and via contacts in multiple ILD layers. The interconnect lines and via contacts in interconnect layer 322 can include conductive materials including, but not limited to, tungsten (W), cobalt (Co), copper (Cu), aluminum (Al), silicides, or any combination thereof. The ILD layers in interconnect layer 322 can include dielectric materials including, but not limited to, silicon oxide, silicon nitride, silicon oxynitride, low dielectric constant (low-k) dielectrics, or any combination thereof. In some embodiments, the devices in device layer 310 are electrically connected to one another through the interconnects in interconnect layer 322. For example, array of embedded DRAM cells 314 may be electrically connected to processors 312 through interconnect layer 322.

As shown in FIG. 3A, first semiconductor structure 302 of unified semiconductor chip 300 can further include a bonding layer 324 at bonding interface 306 and above interconnect layer 322 and device layer 310 (including processors 312 and array of embedded DRAM cells 314). Bonding layer 324 can include a plurality of bonding contacts 326 and dielectrics electrically isolating bonding contacts 326. Bonding contacts 326 can include conductive materials including, but not limited to, W, Co, Cu, Al, silicides, or any combination thereof. The remaining area of bonding layer 324 can be formed with dielectrics including, but not limited to, silicon oxide, silicon nitride, silicon oxynitride, low-k dielectrics, or any combination thereof. Bonding contacts 326 and surrounding dielectrics in bonding layer 324 can be used for hybrid bonding.

Similarly, as shown in FIG. 3A, second semiconductor structure 304 of unified semiconductor chip 300 can also include a bonding layer 328 at bonding interface 306 and above bonding layer 324 of first semiconductor structure 302. Bonding layer 328 can include a plurality of bonding contacts 330 and dielectrics electrically isolating bonding contacts 330. Bonding contacts 330 can include conductive materials including, but not limited to, W, Co, Cu, Al, silicides, or any combination thereof. The remaining area of bonding layer 328 can be formed with dielectrics including, but not limited to, silicon oxide, silicon nitride, silicon oxynitride, low-k dielectrics, or any combination thereof. Bonding contacts 330 and surrounding dielectrics in bonding layer 328 can be used.

As described above, second semiconductor structure 304 can be bonded on top of first semiconductor structure 302 in a face-to-face manner at bonding interface 306. In some embodiments, bonding interface 306 is disposed between bonding layers 324 and 328 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 306 is the place at which bonding layers 324 and 328 are met and bonded. In practice, bonding interface 306 can be a layer with a certain thickness that includes the top surface of bonding layer 324 of first semiconductor structure 302 and the bottom surface of bonding layer 328 of second semiconductor structure 304.

In some embodiments, second semiconductor structure 304 of unified semiconductor chip 300 further includes an interconnect layer 332 above bonding layer 328 to transfer electrical signals. Interconnect layer 332 can include a plurality of interconnects, such as MEOL interconnects and BEOL interconnects. Interconnect layer 332 can further include one or more ILD layers in which the interconnect lines and via contacts can form. The interconnect lines and via contacts in interconnect layer 332 can include conductive materials including, but not limited to, W, Co, Cu, Al, silicides, or any combination thereof. The ILD layers in interconnect layer 332 can include dielectric materials including, but not limited to, silicon oxide, silicon nitride, silicon oxynitride, low-k dielectrics, or any combination thereof.

In some embodiments, second semiconductor structure 304 of unified semiconductor chip 300 includes a NAND Flash memory device in which memory cells are provided in the form of an array of 3D NAND memory strings 338 above interconnect layer 332 and bonding layer 328. Each 3D NAND memory string 338 extends vertically through a plurality of pairs each including a conductor layer 334 and a dielectric layer 336, according to some embodiments. The stacked and interleaved conductor layers 334 and dielectric layer 336 are also referred to herein as a memory stack 333. Interleaved conductor layers 334 and dielectric layers 336 in memory stack 333 alternate in the vertical direction, according to some embodiments. In other words, except the ones at the top or bottom of memory stack 333, each conductor layer 334 can be adjoined by two dielectric layers 336 on both sides, and each dielectric layer 336 can be adjoined by two conductor layers 334 on both sides. Conductor layers 334 can each have the same thickness or different thicknesses. Similarly, dielectric layers 336 can each have the same thickness or different thicknesses. Conductor layers 334 can include conductor materials including, but not limited to, W, Co, Cu, Al, doped silicon, silicides, or any combination thereof. Dielectric layers 336 can include dielectric materials including, but not limited to, silicon oxide, silicon nitride, silicon oxynitride, or any combination thereof.

In some embodiments, each 3D NAND memory string 338 is a "charge trap" type of NAND memory string including a semiconductor channel 342 and a memory film 340. In some embodiments, semiconductor channel 342 includes silicon, such as amorphous silicon, polysilicon, or single crystalline silicon. In some embodiments, memory film 340 is a composite dielectric layer including a tunneling layer, a storage layer (also known as "charge trap/storage layer"), and a blocking layer. Each 3D NAND memory string 338 can have a cylinder shape (e.g., a pillar shape). Semiconductor channel 342, the tunneling layer, the storage layer, and the blocking layer of memory film 340 are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, 3D NAND memory strings 338 further include a plurality of control gates (each being part of a word line). Each conductor layer 334 in memory stack 333 can act as a control gate for each memory cell of 3D NAND memory string 338. In some embodiments, each 3D NAND memory string 338 includes two plugs 344 and 346 at a respective end in the vertical direction. Plug 344 can include a semiconductor material, such as single-crystal silicon, that is epitaxially grown from a semiconductor layer 348. Plug 344 can function as the channel controlled by a source select gate of 3D NAND memory string 338. Plug 344 can be at the upper end of 3D NAND memory string 338 and in contact with semiconductor channel 342. As used herein, the "upper end" of a component (e.g., 3D NAND memory string 338) is the end father away from substrate 308 in the y-direction, and the "lower end" of the component (e.g., 3D NAND memory string 338) is the end closer to substrate 308 in the y-direction when substrate 308 is positioned in the lowest plane of unified semiconductor chip 300. Another Plug 346 can include semiconductor materials (e.g., polysilicon) or conductor materials (e.g., metals). In some embodiments, plug 346 includes an opening filled with titanium/titanium nitride (Ti/TiN, as a barrier and glue layer) and tungsten (as a conductor). By covering the upper end of 3D NAND memory string 338 during the fabrication of second semiconductor structure 304, plug 346 can function as an etch stop layer to prevent etching of dielectrics filled in 3D NAND memory string 338, such as silicon oxide and silicon nitride. In some embodiments, plug 346 functions as the drain of 3D NAND memory string 338.

In some embodiments, second semiconductor structure 304 further includes semiconductor layer 348 disposed above memory stack 333 and 3D NAND memory strings 338. Semiconductor layer 348 can be a thinned substrate on which memory stack 333 and 3D NAND memory strings 338 are formed. In some embodiments, semiconductor layer 348 includes single-crystal silicon from which plugs 344 can be epitaxially grown. In some embodiments, semiconductor layer 348 can include polysilicon, amorphous silicon, SiGe, GaAs, Ge, or any other suitable materials. Semiconductor layer 348 can also include isolation regions and doped regions (e.g., functioning as an array common source for 3D NAND memory strings 338, not shown). Isolation regions (not shown) can extend across the entire thickness or part of the thickness of semiconductor layer 348 to electrically isolate the doped regions. In some embodiments, a pad oxide layer including silicon oxide is disposed between memory stack 333 and semiconductor layer 348.

It is understood that 3D NAND memory strings 338 are not limited to the "charge trap" type of 3D NAND memory strings and may be "floating gate" type of 3D NAND memory strings in other embodiments. Semiconductor layer 348 may include polysilicon as the source plate of the "floating gate" type of 3D NAND memory strings.

As shown in FIG. 3A, second semiconductor structure 304 of unified semiconductor chip 300 can further include a pad-out interconnect layer 350 above semiconductor layer 348. Pad-out interconnect layer 350 include interconnects, e.g., contact pads 352, in one or more ILD layers. Pad-out interconnect layer 350 and interconnect layer 332 can be formed at opposite sides of semiconductor layer 348. In some embodiments, the interconnects in pad-out interconnect layer 350 can transfer electrical signals between unified semiconductor chip 300 and outside circuits, e.g., for pad-out purposes.

In some embodiments, second semiconductor structure 304 further includes one or more contacts 354 extending through semiconductor layer 348 to electrically connect pad-out interconnect layer 350 and interconnect layers 332 and 322. As a result, array of embedded DRAM cells 314 can be electrically connected to array of 3D NAND memory strings 338 through interconnect layers 322 and 332 as well as bonding contacts 326 and 330. One or more processors 312 (and controllers and the peripheral circuit if any) can also be electrically connected to array of 3D NAND memory strings 338 through interconnect layers 322 and 332 as well as bonding contacts 326 and 330. Moreover, processors 312, array of embedded DRAM cells 314, and array of 3D NAND memory strings 338 can be electrically connected to outside circuits through contacts 354 and pad-out interconnect layer 350.

Figure 3B:
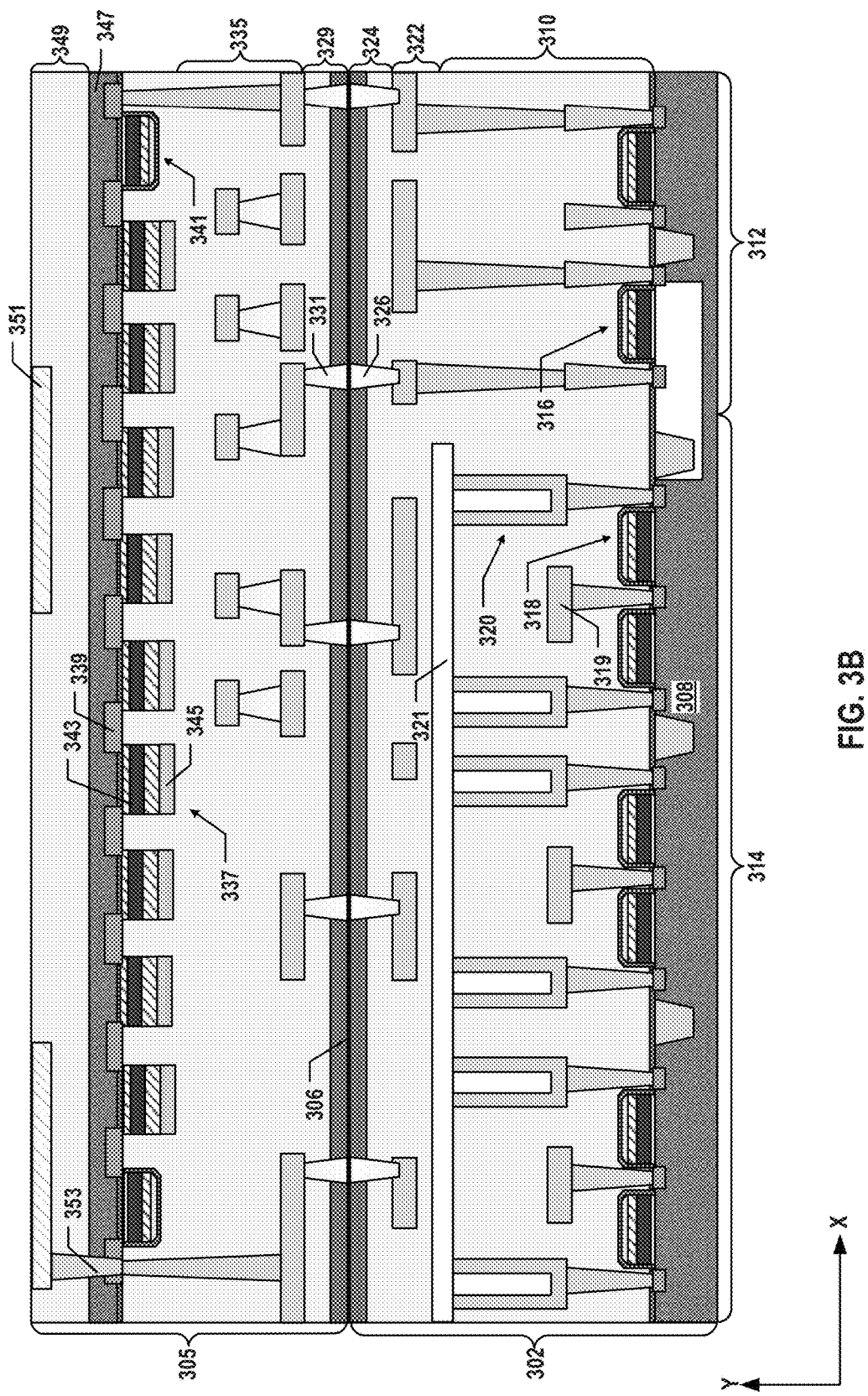
FIG. 3B illustrates a cross-section of an exemplary unified semiconductor chip having two-dimensional (2D) NAND memory, according to some embodiments.

FIG. 3B illustrates a cross-section of an exemplary unified semiconductor chip 301 having 2D NAND memory, according to some embodiments. Similar to unified semiconductor chip 300 described above in FIG. 3A, unified semiconductor chip 301 represents an example of a bonded chip including first semiconductor structure 302 having one or more processors 312 and embedded DRAM cells 314. Different from unified semiconductor chip 300 described above in FIG. 3A that includes second semiconductor structure 304 having 3D NAND memory strings 338, unified semiconductor chip 301 in FIG. 3B includes a second semiconductor structure 305 having 2D NAND memory cells 337. Similar to unified semiconductor chip 300 described above in FIG. 3A, first and second semiconductor structures 302 and 305 of unified semiconductor chip 301 are bonded in a face-to-face manner at bonding interface 306, as shown in FIG. 3B. It is understood that the details of similar structures (e.g., materials, fabrication process, functions, etc.) in both unified semiconductor chips 300 and 301 may not be repeated below.

Similarly, as shown in FIG. 3B, second semiconductor structure 305 of unified semiconductor chip 301 can also include a bonding layer 329 at bonding interface 306 and above bonding layer 324 of first semiconductor structure 302. Bonding layer 329 can include a plurality of bonding contacts 331 and dielectrics electrically isolating bonding contacts 331. Bonding contacts 331 and surrounding dielectrics in bonding layer 329 can be used for hybrid bonding. In some embodiments, second semiconductor structure 305 of unified semiconductor chip 301 further includes an interconnect layer 335 above bonding layer 329 to transfer electrical signals. Interconnect layer 335 can include a plurality of interconnects, such as MEOL interconnects and BEOL interconnects. Interconnect layer 335 can further include one or more ILD layers in which the interconnect lines and via contacts can form.

In some embodiments, second semiconductor structure 305 of unified semiconductor chip 301 includes a NAND Flash memory device in which memory cells are provided in the form of an array of 2D NAND memory cells 337 above interconnect layer 335 and bonding layer 329. Array of 2D NAND memory cells 337 can include a plurality of 2D NAND memory strings, each of which includes a plurality of memory cells 337 connected in series by sources/drains 339 (resembling a NAND gate) and two select transistors 341 at the ends of the 2D NAND memory string, respectively. In some embodiments, each 2D NAND memory string further includes one or more select gates and/or dummy gates besides select transistors 341. In some embodiments, each 2D NAND memory cell 337 includes a floating-gate transistor having a floating gate 343 and a control gate 345 stacked vertically. Floating gate 343 can include semiconductor materials, such as polysilicon. Control gate 345 can be part of the word line of the NAND Flash memory device and include conductive materials including, but not limited to, W, Co, Cu, Al, doped polysilicon, silicides, or any combination thereof. In some embodiments, the floating-gate transistor further includes dielectric layers, such as a blocking layer disposed vertically between control gate 345 and floating gate 343 and a tunneling layer disposed above floating gate 343. The blocking layer can include silicon oxide, silicon oxynitride, high-k dielectrics, or any combination thereof. The tunneling layer can include silicon oxide, silicon oxynitride, or a combination thereof. Channels can be formed laterally between sources/drains 339 and above the gate stacks (including the tunneling layer, floating gate 343, the blocking layer, and control gate 345). Each channel is controlled by the voltage signal applied to the respective gate stack through control gate 345, according to some embodiments. It is understood that 2D NAND memory cell 337 may include a charge-trap transistor, which replaces floating gate 343 with a storage layer as described above in detail. In some embodiments, the storage layer includes silicon nitride, silicon oxynitride, or any combination thereof and has a thickness smaller than that of floating gate 343.

In some embodiments, second semiconductor structure 305 further includes semiconductor layer 347 disposed above and in contact with array of 2D NAND memory cells 337. Semiconductor layer 347 can be a thinned substrate on which 2D NAND memory cells 337 are formed. In some embodiments, semiconductor layer 347 includes single-crystal silicon. In some embodiments, semiconductor layer 347 includes polysilicon, amorphous silicon, SiGe, GaAs, Ge, or any other suitable materials. Semiconductor layer 347 can also include isolation regions and doped regions (e.g., functioning as sources/drains 339 of 2D NAND memory cells 337).

As shown in FIG. 3B, second semiconductor structure 305 of unified semiconductor chip 301 can further include a pad-out interconnect layer 349 above semiconductor layer 347. Pad-out interconnect layer 349 includes interconnects, e.g., contact pads 351, in one or more ILD layers, according to some embodiments. Pad-out interconnect layer 349 and interconnect layer 335 can be formed at opposite sides of semiconductor layer 347. The interconnects in pad-out interconnect layer 349 can transfer electrical signals between unified semiconductor chip 301 and outside circuits, e.g., for pad-out purposes.

In some embodiments, second semiconductor structure 305 further includes one or more contacts 353 extending vertically through semiconductor layer 347 to electrically connect pad-out interconnect layer 349 and interconnect layers 335 and 322. As a result, embedded DRAM cells 314 can be electrically connected to 2D NAND memory cells 337 through interconnect layers 322 and 335 as well as bonding contacts 326 and 331. One or more processors 312 (and controllers and the peripheral circuit if any) can also be electrically connected to 2D NAND memory cells 337 through interconnect layers 322 and 335 as well as bonding contacts 326 and 331. Moreover, processors 312, embedded DRAM cells 314, and 2D NAND memory cells 337 can be electrically connected to outside circuits through contacts 353 and pad-out interconnect layer 349.

Figure 4A:
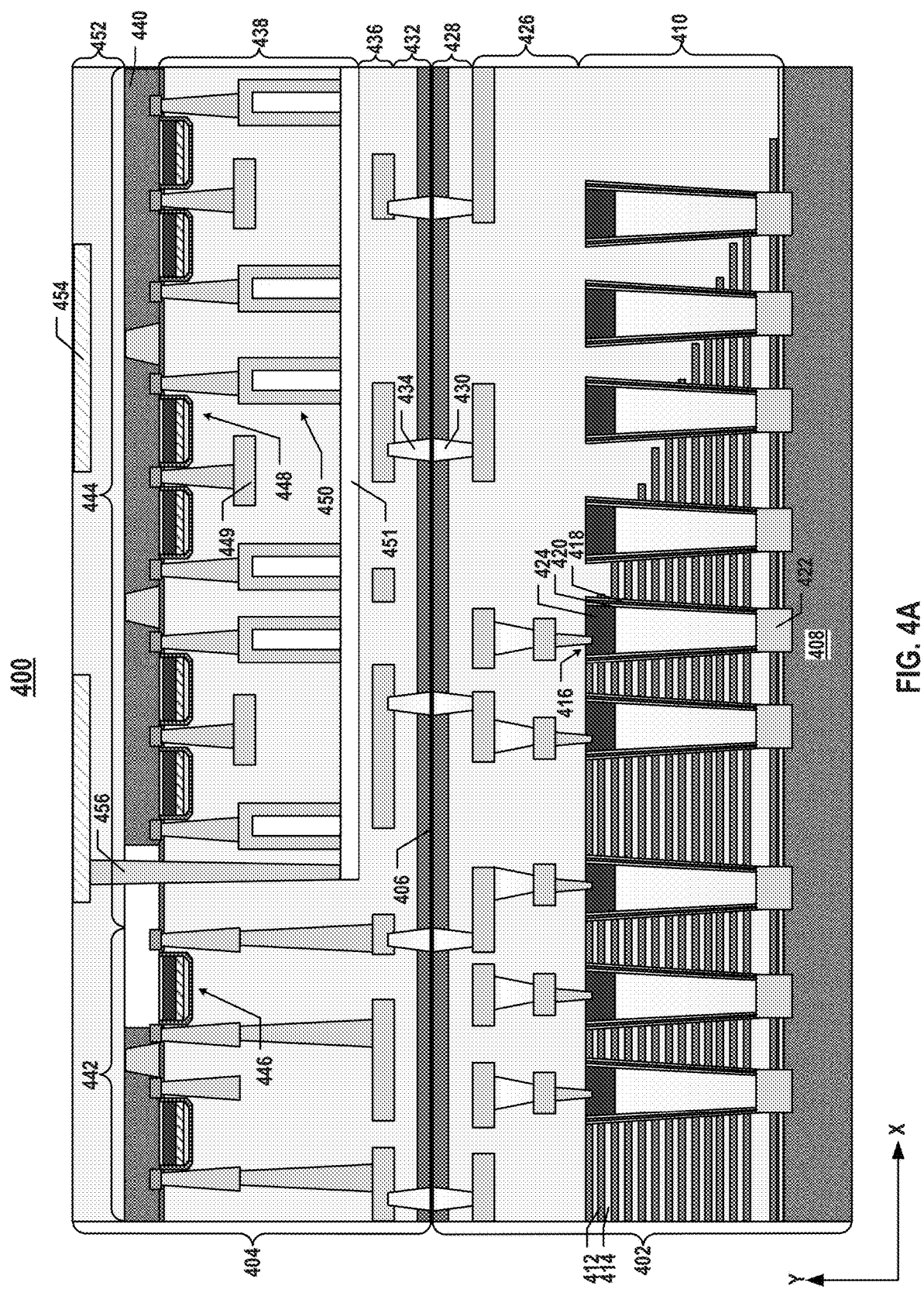
FIG. 4A illustrates a cross-section of another exemplary unified semiconductor chip having 3D NAND memory, according to some embodiments.

FIG. 4A illustrates a cross-section of another exemplary unified semiconductor chip 400 having 3D NAND memory, according to some embodiments. Similar to unified semiconductor chip 300 described above in FIG. 3A, unified semiconductor chip 400 represents an example of a bonded chip in which a first semiconductor structure 402 including 3D NAND memory strings and a second semiconductor structure 404 including one or more processors and embedded DRAM cells are formed separately and bonded in a face-to-face manner at a bonding interface 406. Different from unified semiconductor chip 300 described above in FIG. 3A in which first semiconductor structure 302 including the processors and embedded DRAM cells is below second semiconductor structure 304 including the 3D NAND memory strings, unified semiconductor chip 400 in FIG. 4A includes second semiconductor structure 404 including one or more processors and embedded DRAM cells disposed above first semiconductor structure 402 including 3D NAND memory strings. It is understood that the details of similar structures (e.g., materials, fabrication process, functions, etc.) in both unified semiconductor chips 300 and 400 may not be repeated below.

First semiconductor structure 402 of unified semiconductor chip 400 can include a substrate 408 and a memory stack 410 including interleaved conductor layers 412 and dielectric layers 414 above substrate 408. In some embodiments, an array of 3D NAND memory strings 416 each extends vertically through interleaved conductor layers 412 and dielectric layers 414 in memory stack 410 above substrate 408. Each 3D NAND memory string 416 can include a semiconductor channel 420 and a memory film 418. Each 3D NAND memory string 416 further includes two plugs 422 and 424 at its lower end and upper end, respectively. 3D NAND memory strings 416 can be "charge trap" type of 3D NAND memory strings or "floating gate" type of 3D NAND memory strings. In some embodiments, a pad oxide layer including silicon oxide is disposed between memory stack 410 and substrate 408.

In some embodiments, first semiconductor structure 402 of unified semiconductor chip 400 also includes an interconnect layer 426 above memory stack 410 and 3D NAND memory strings 416 to transfer electrical signals to and from 3D NAND memory strings 416. Interconnect layer 426 can include a plurality of interconnects, including interconnect lines and via contacts. In some embodiments, the interconnects in interconnect layer 426 also include local interconnects, such as bit line contacts and word line contacts. In some embodiments, first semiconductor structure 402 of unified semiconductor chip 400 further includes a bonding layer 428 at bonding interface 406 and above interconnect layer 426 and memory stack 410. Bonding layer 428 can include a plurality of bonding contacts 430 and dielectrics surrounding and electrically isolating bonding contacts 430.

As shown in FIG. 4A, second semiconductor structure 404 of unified semiconductor chip 400 includes another bonding layer 432 at bonding interface 406 and above bonding layer 428. Bonding layer 432 can include a plurality of bonding contacts 434 and dielectrics surrounding and electrically isolating bonding contacts 434. In some embodiments, second semiconductor structure 404 of unified semiconductor chip 400 also includes an interconnect layer 436 above bonding layer 432 to transfer electrical signals. Interconnect layer 436 can include a plurality of interconnects, including interconnect lines and via contacts.

Second semiconductor structure 404 of unified semiconductor chip 400 can further include a device layer 438 above interconnect layer 436 and bonding layer 432. In some embodiments, device layer 438 includes one or more processors 442 above interconnect layer 436 and bonding layer 432 and an array of embedded DRAM cells 444 above interconnect layer 436 and bonding layer 432 and outside of processors 442. In some embodiments, the devices in device layer 438 are electrically connected to one another through the interconnects in interconnect layer 436. For example, array of embedded DRAM cells 444 may be electrically connected to processors 442 through interconnect layer 436.

In some embodiments, processors 442 include a plurality of logic transistors 446 forming any suitable specialized processors and/or SoCs, such as an application processor (e.g., including one or more CPUs and GPUs) and a baseband processor. Device layer 438 can also include one or more controllers and/or the peripheral circuit of the 3D NAND memory formed by logic transistors 446 as described above in detail. Logic transistors 446 can be formed "on" a semiconductor layer 440, in which the entirety or part of logic transistors 446 are formed in semiconductor layer 440 and/or directly on semiconductor layer 440. Isolation regions (e.g., STIs) and doped regions (e.g., source regions and drain regions of logic transistors 446) can be formed in semiconductor layer 440 as well.

In some embodiments, each embedded DRAM cell 444 includes a DRAM selection transistor 448 and a capacitor 450. Embedded DRAM cell 444 can be a 1T1C cell consisting of one transistor and one capacitor. It is understood that embedded DRAM cell 444 may be of any suitable configurations, such as 2T1C cell, 3T1C cell, etc. In some embodiments, DRAM selection transistors 448 are formed "on" semiconductor layer 440, in which the entirety or part of DRAM selection transistors 448 are formed in semiconductor layer 440 and/or directly on semiconductor layer 440. Isolation regions (e.g., STIs) and doped regions (e.g., source regions and drain regions of DRAM selection transistors 448) can be formed in semiconductor layer 440 as well. As shown in FIG. 4A, DRAM selection transistors 448 and logic transistors 446 can be formed in different regions on the same plane, e.g., on semiconductor layer 440. That is, DRAM selection transistors 448 can be formed outside of the region in which processors 442 are formed on semiconductor layer 440. In some embodiments, capacitors 450 are disposed below DRAM selection transistors 448. Each capacitor 450 includes two electrodes, one of which is electrically connected to one node of respective DRAM selection transistor 448, according to some embodiments. Another node of each DRAM selection transistor 448 is electrically connected to a bit line 449 of embedded DRAM, according to some embodiments. Another electrode of each capacitor 450 can be electrically connected to a common plate 451, e.g., a common ground. It is understood that the structure and configuration of embedded DRAM cell 444 are not limited to the example in FIG. 4A and may include any suitable structure and configuration. For example, capacitor 450 may be a planar capacitor, a stack capacitor, a multi-fins capacitor, a cylinder capacitor, a trench capacitor, or a substrate-plate capacitor.

In some embodiments, second semiconductor structure 404 further includes semiconductor layer 440 disposed above device layer 438. Semiconductor layer 440 can be a thinned substrate on which logic transistors 446 and DRAM selection transistors 448 are formed. In some embodiments, semiconductor layer 440 includes single-crystal silicon. In some embodiments, semiconductor layer 440 can include polysilicon, amorphous silicon, SiGe, GaAs, Ge, or any other suitable materials. Semiconductor layer 440 can also include isolation regions and doped regions.

As shown in FIG. 4A, second semiconductor structure 404 of unified semiconductor chip 400 can further include a pad-out interconnect layer 452 above semiconductor layer 440. Pad-out interconnect layer 452 include interconnects, e.g., contact pads 454, in one or more ILD layers. In some embodiments, the interconnects in pad-out interconnect layer 452 can transfer electrical signals between unified semiconductor chip 400 and outside circuits, e.g., for pad-out purposes. In some embodiments, second semiconductor structure 404 further includes one or more contacts 456 extending through semiconductor layer 440 to electrically connect pad-out interconnect layer 452 and interconnect layers 436 and 426. As a result, array of embedded DRAM cells 444 can be electrically connected to array of 3D NAND memory strings 416 through interconnect layers 426 and 436 as well as bonding contacts 430 and 434. One or more processors 442 (and controllers and the peripheral circuit if any) can also be electrically connected to array of 3D NAND memory strings 416 through interconnect layers 426 and 436 as well as bonding contacts 430 and 434. Moreover, processors 442, array of embedded DRAM cells 444, and array of 3D NAND memory strings 416 can be electrically connected to outside circuits through contacts 456 and pad-out interconnect layer 452.

Figure 4B:
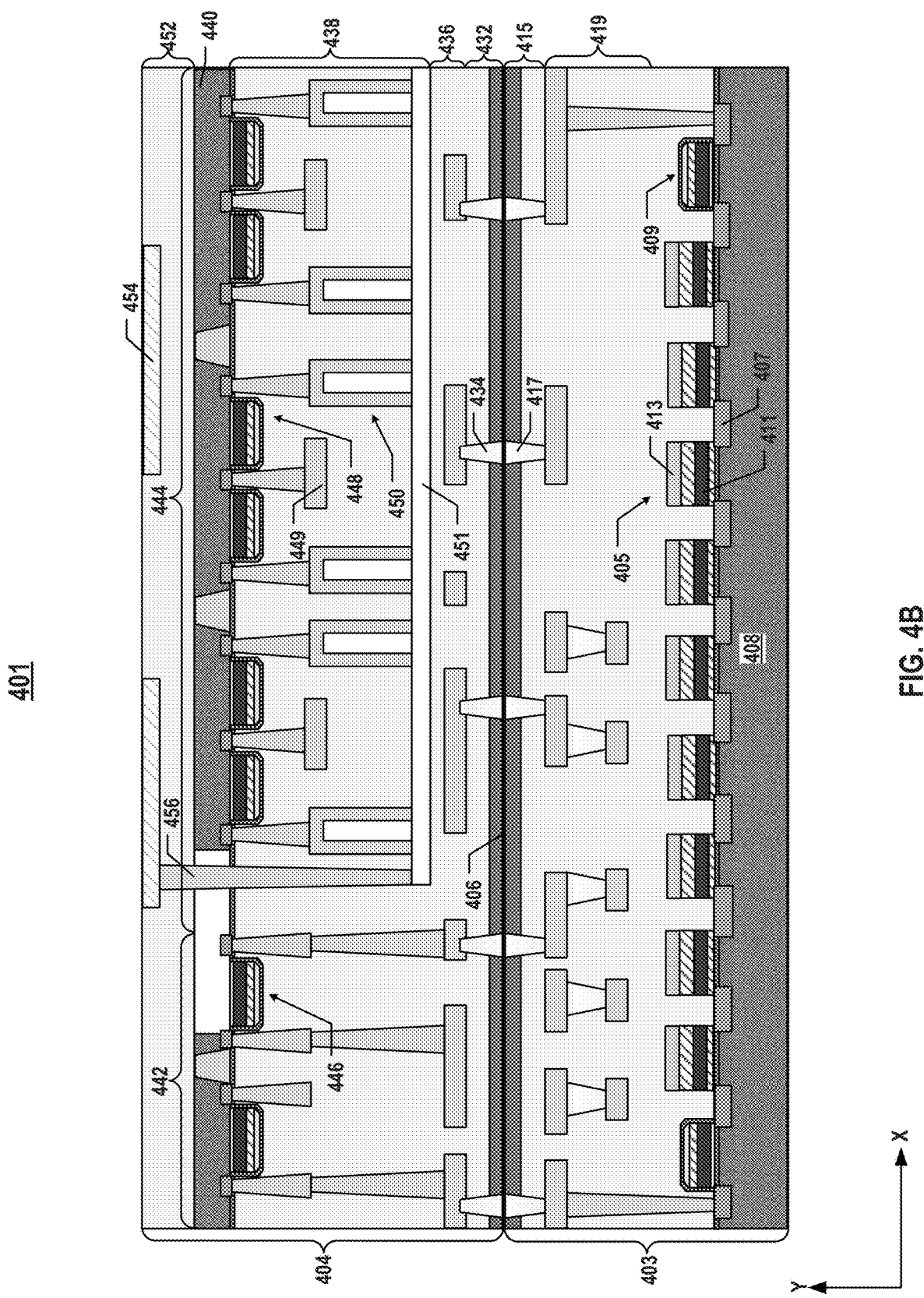
FIG. 4B illustrates a cross-section of another exemplary unified semiconductor chip having 2D NAND memory, according to some embodiments.

FIG. 4B illustrates a cross-section of another exemplary unified semiconductor chip 401 having 2D NAND memory, according to some embodiments. Similar to unified semiconductor chip 400 described above in FIG. 4A, unified semiconductor chip 401 represents an example of a bonded chip including second semiconductor structure 404 having one or more processors 442 and embedded DRAM cells 444. Different from unified semiconductor chip 400 described above in FIG. 4A that includes first semiconductor structure 402 having 3D NAND memory strings 416, unified semiconductor chip 401 in FIG. 4B includes a first semiconductor structure 403 having 2D NAND memory cells 405. Similar to unified semiconductor chip 400 described above in FIG. 4A, first and second semiconductor structures 403 and 404 of unified semiconductor chip 401 are bonded in a face-to-face manner at bonding interface 406, as shown in FIG. 4B. It is understood that the details of similar structures (e.g., materials, fabrication process, functions, etc.) in both unified semiconductor chips 400 and 401 may not be repeated below.

In some embodiments, first semiconductor structure 403 of unified semiconductor chip 401 includes a NAND Flash memory device in which memory cells are provided in the form of an array of 2D NAND memory cells 405 on substrate 408. Array of 2D NAND memory cells 405 can include a plurality of 2D NAND memory strings, each of which includes a plurality of memory cells connected in series by sources/drains 407 (resembling a NAND gate) and two select transistors 409 at the ends of the 2D NAND memory string, respectively. In some embodiments, each 2D NAND memory cell 405 includes a floating-gate transistor having a floating gate 411 and a control gate 413 stacked vertically. In some embodiments, the floating-gate transistor further includes dielectric layers, such as a blocking layer disposed vertically between control gate 413 and floating gate 411 and a tunneling layer disposed below floating gate 411. Channels can be formed laterally between sources/drains 407 and below the gate stacks (including the tunneling layer, floating gate 411, the blocking layer, and control gate 413). Each channel is controlled by the voltage signal applied to the respective gate stack through control gate 413, according to some embodiments. It is understood that 2D NAND memory cell 405 may include a charge-trap transistor, which replaces floating gate 411 with a storage layer as described above in detail.

In some embodiments, first semiconductor structure 403 of unified semiconductor chip 401 also includes an interconnect layer 419 above 2D NAND memory cells 405 to transfer electrical signals to and from 2D NAND memory cells 405. Interconnect layer 419 can include a plurality of interconnects, including interconnect lines and via contacts. In some embodiments, the interconnects in interconnect layer 419 also include local interconnects, such as bit line contacts and word line contacts. In some embodiments, first semiconductor structure 403 of unified semiconductor chip 401 further includes a bonding layer 415 at bonding interface 406 and above interconnect layer 419 and 2D NAND memory cells 405. Bonding layer 415 can include a plurality of bonding contacts 417 and dielectrics surrounding and electrically isolating bonding contacts 417.

Figure 5C:
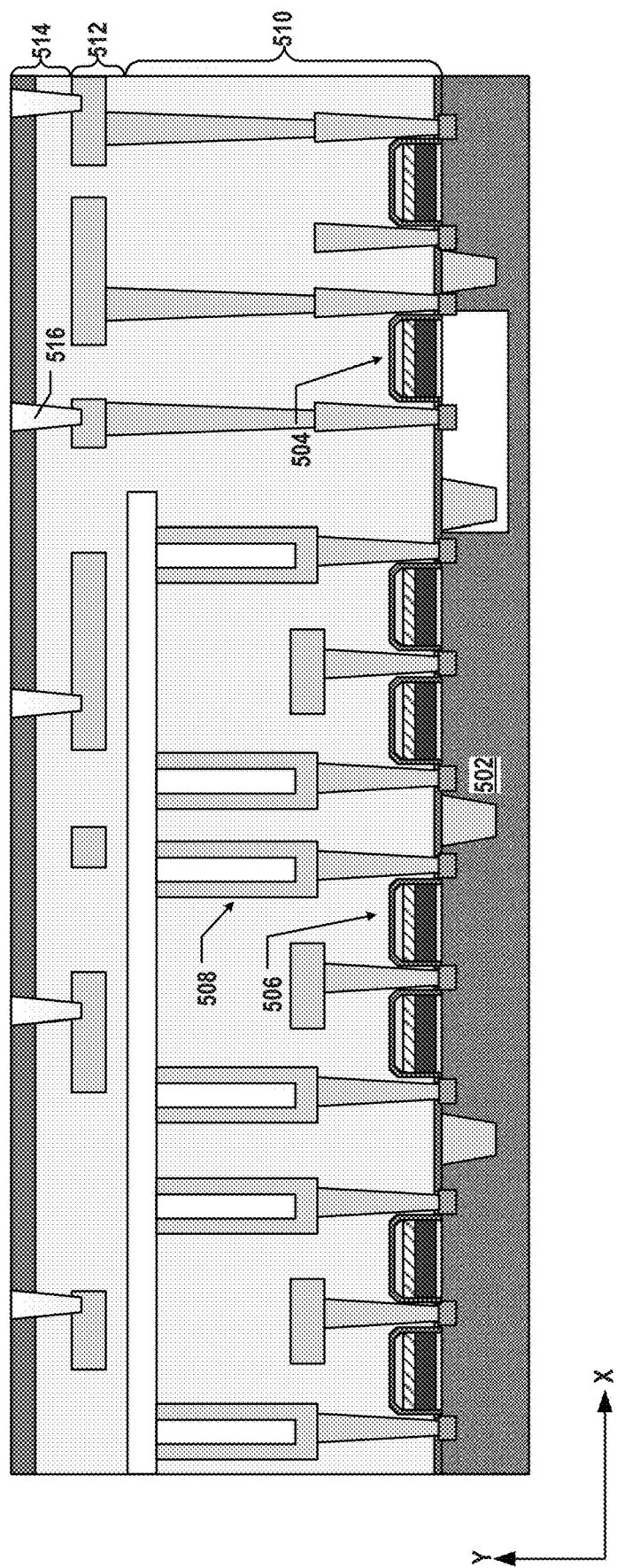
Figure 6A:
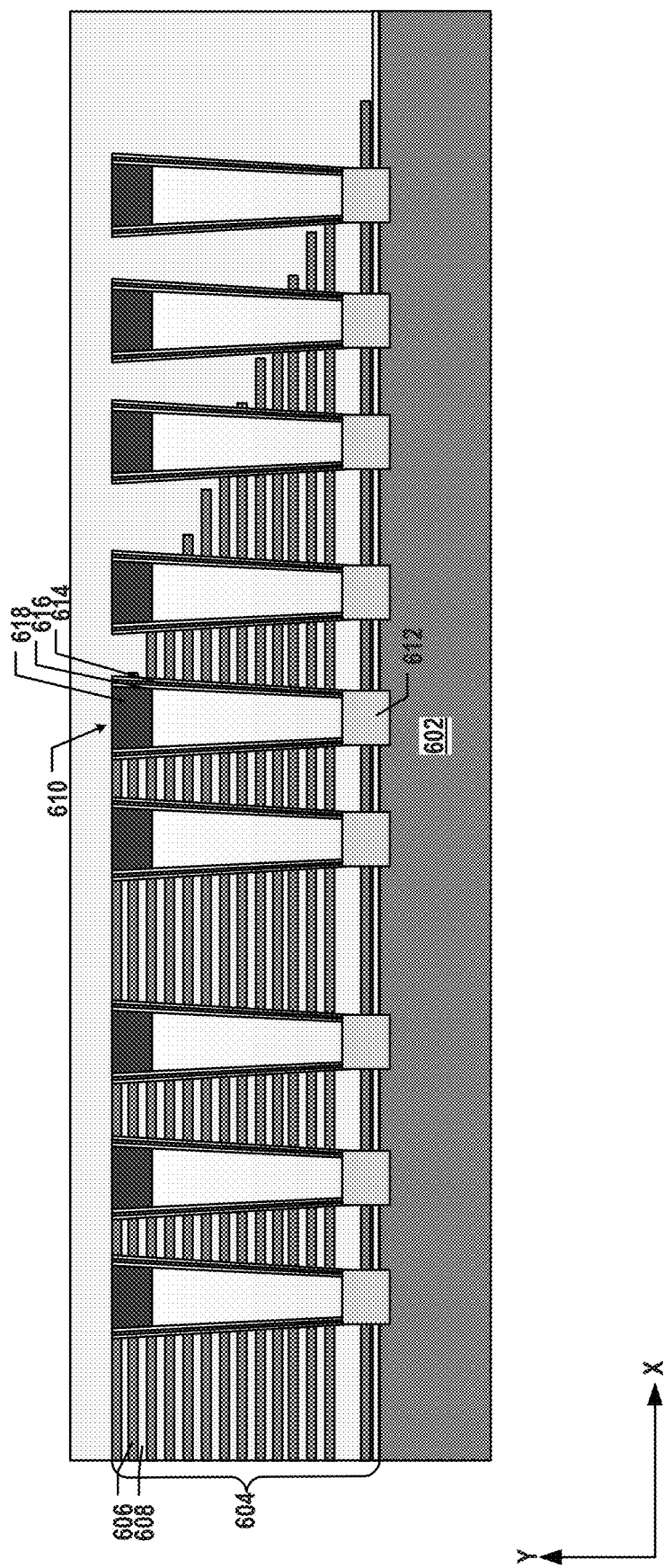
FIGS. 6A and 6B illustrate a fabrication process for forming an exemplary semiconductor structure having 3D NAND memory strings, according to some embodiments.
Figure 6B:
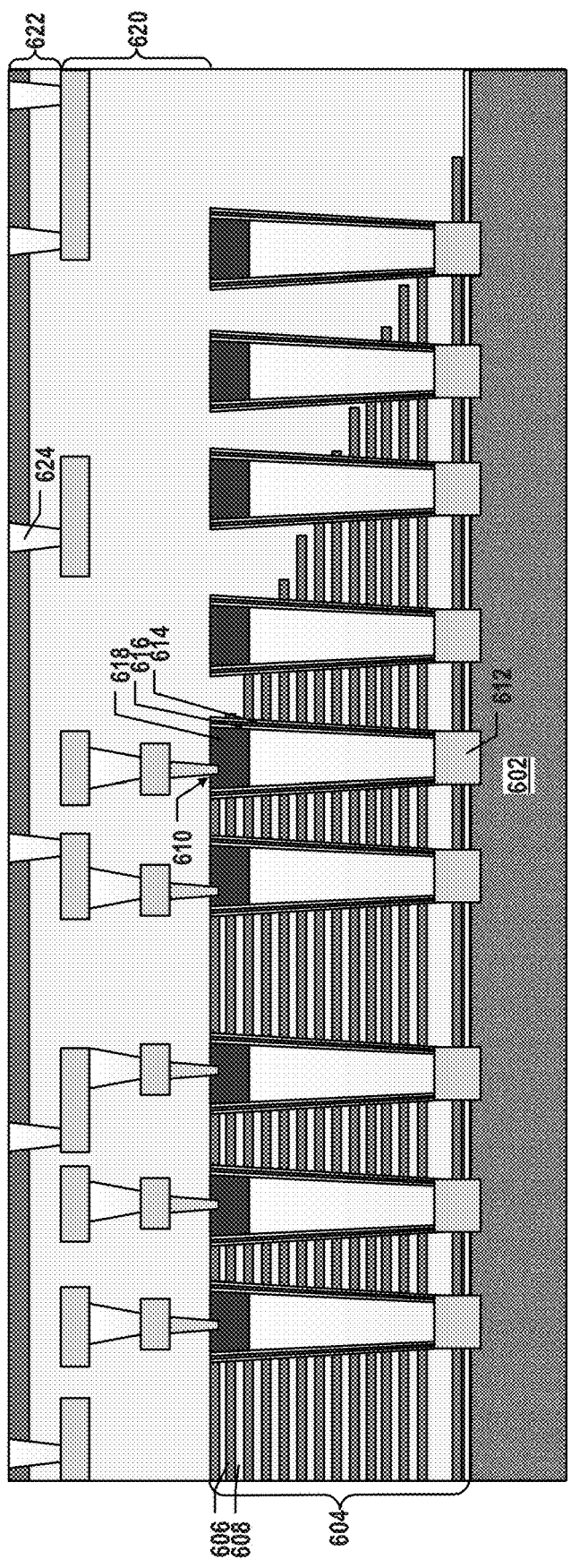
Figure 7A:
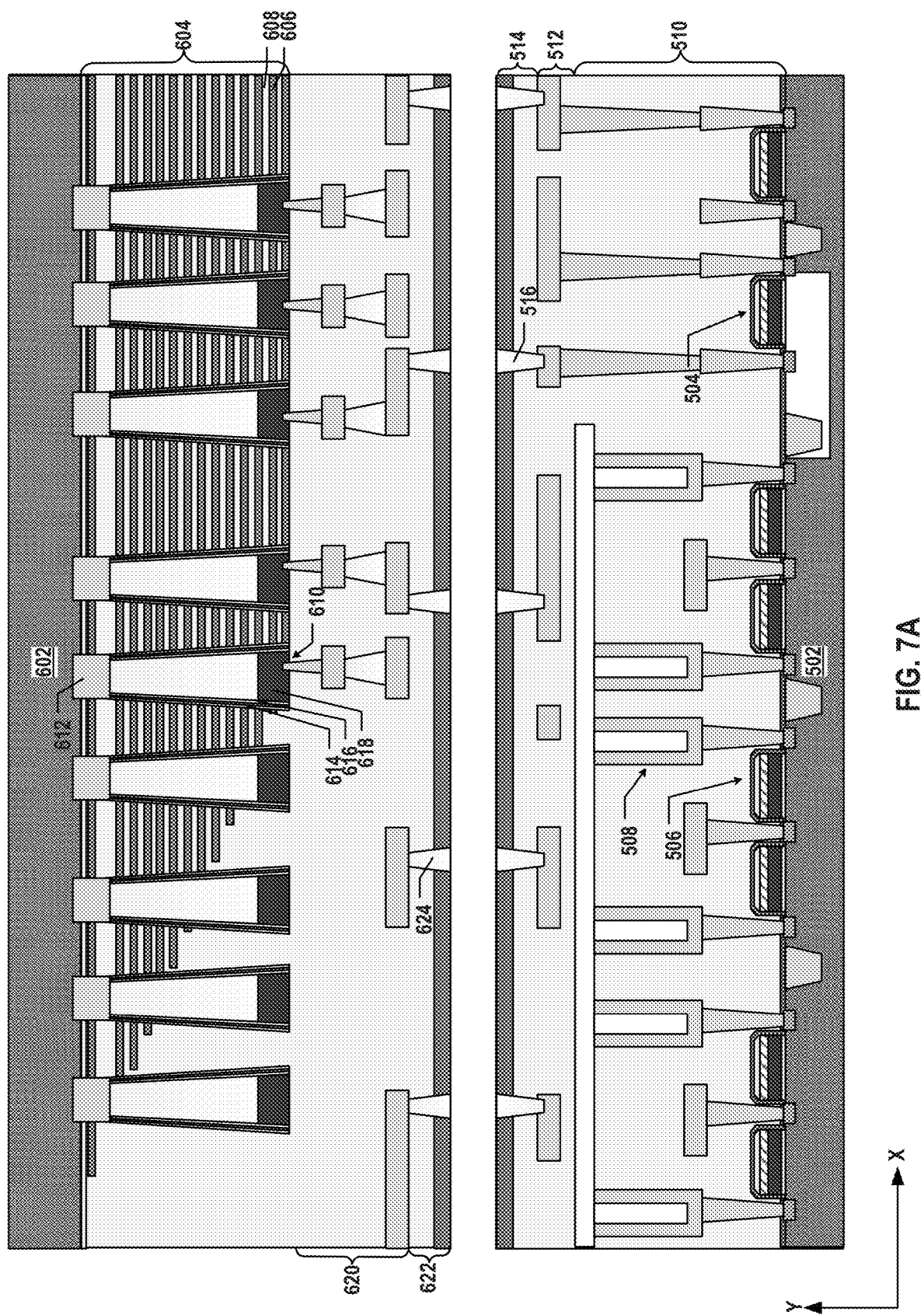
FIGS. 7A and 7B illustrate a fabrication process for forming an exemplary unified semiconductor chip, according to some embodiments.
Figure 7B:
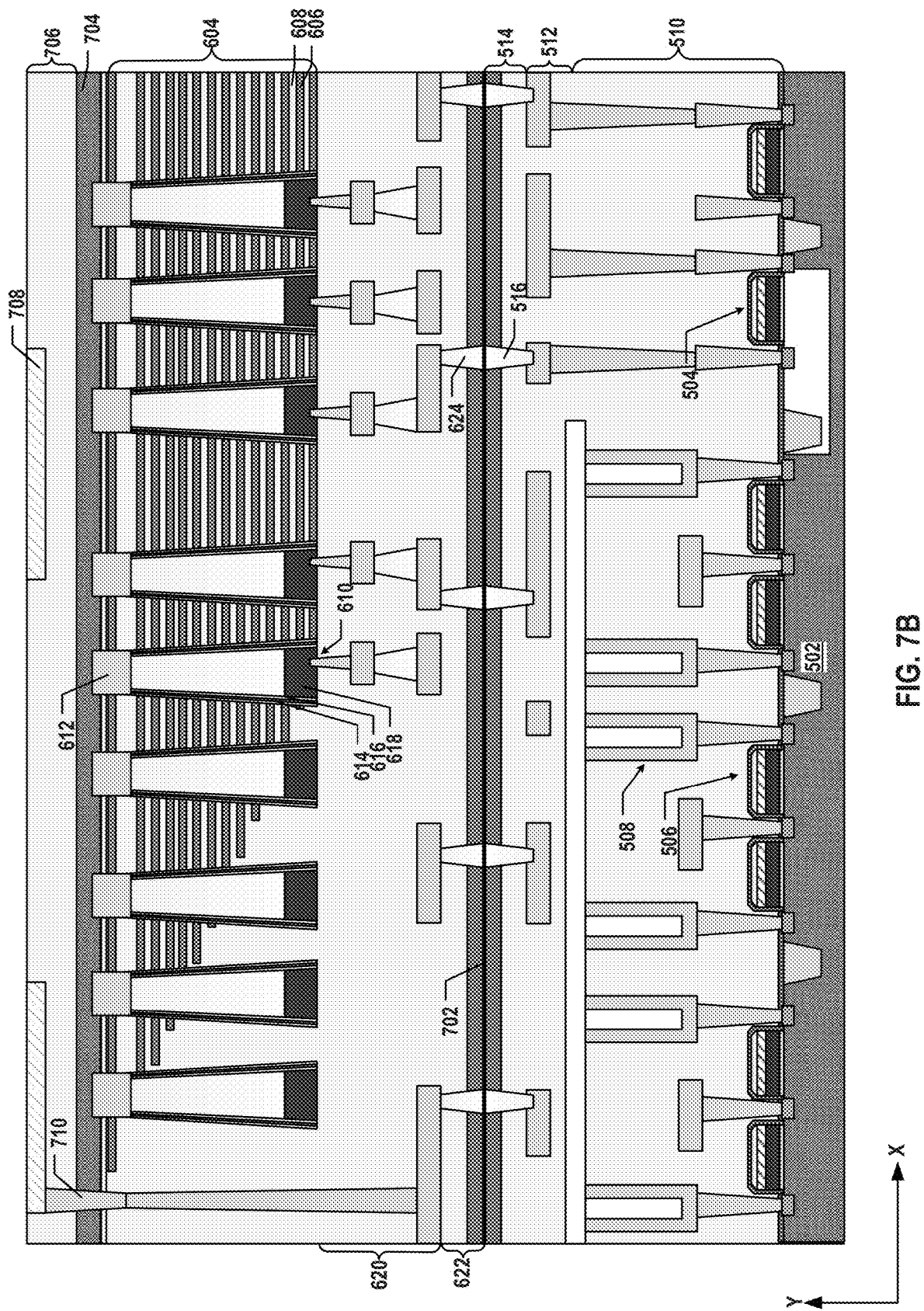
Figure 11A:
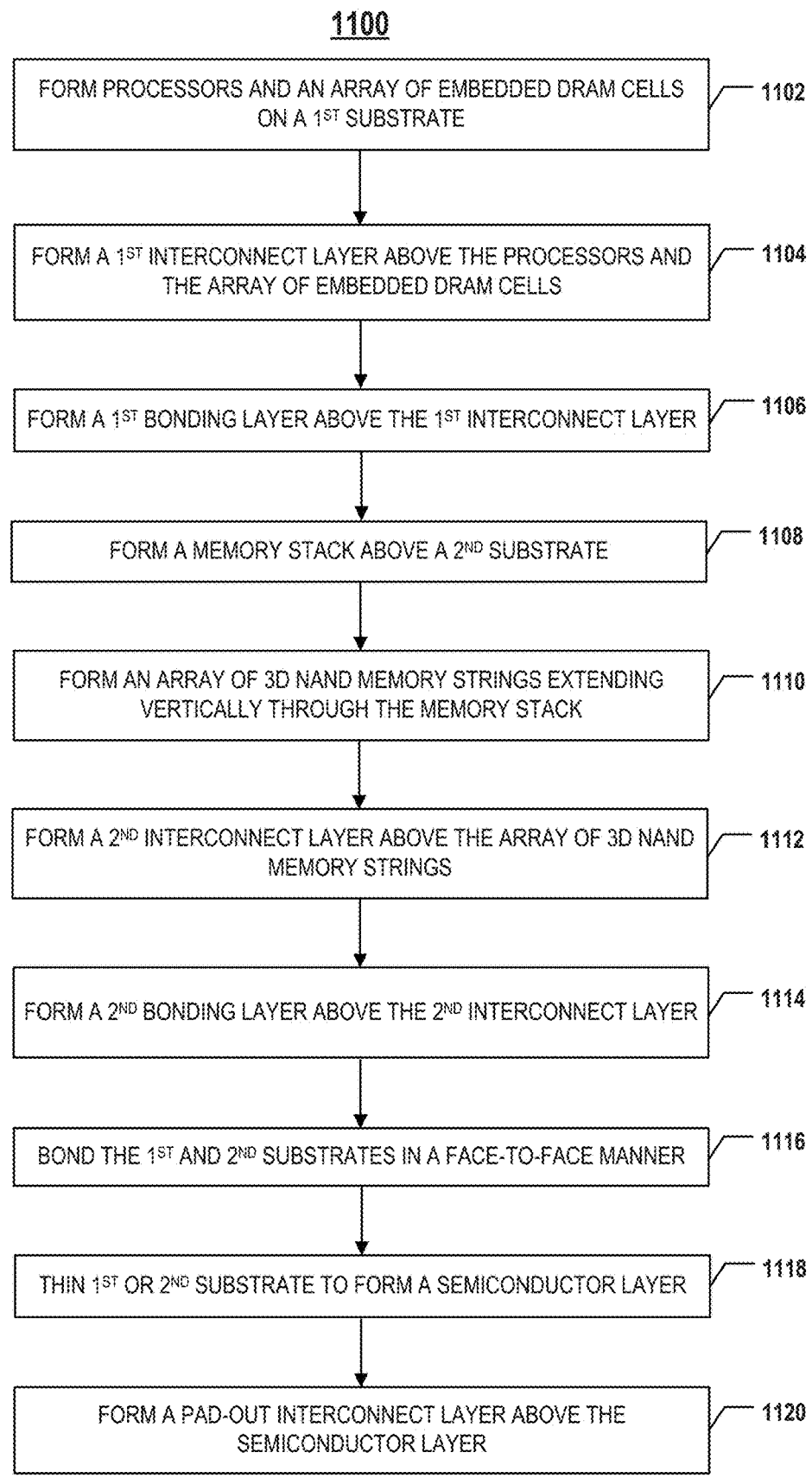
FIG. 11A is a flowchart of an exemplary method for forming a unified semiconductor chip, according to some embodiments.

FIGS. 5A-5C illustrate a fabrication process for forming an exemplary semiconductor structure having one or more processors and an embedded DRAM, according to some embodiments. FIGS. 6A and 6B illustrate a fabrication process for forming an exemplary semiconductor structure having 3D NAND memory strings, according to some embodiments. FIGS. 7A and 7B illustrate a fabrication process for forming an exemplary unified semiconductor chip, according to some embodiments. FIG. 11A is a flowchart of an exemplary method 1100 for forming a unified semiconductor chip, according to some embodiments. Examples of the unified semiconductor chip depicted in FIGS. 5A-5C, 6A, 6B, 7A, 7B, and 11A include unified semiconductor chip 300 depicted in FIG. 3A and unified semiconductor chip 400 depicted in FIG. 4A. FIGS. 5A-5C, 6A, 6B, 7A, 7B, and 11A will be described together. It is understood that the operations shown in method 1100 are not exhaustive and that other operations can be performed as well before, after, or between any of the illustrated operations. Further, some of the operations may be performed simultaneously, or in a different order than shown in FIG. 11A.

As depicted in FIGS. 5A-5C, a first semiconductor structure including one or more processors, an array of embedded DRAM cells, and a first bonding layer including a plurality of first bonding contacts is formed. As depicted in FIGS. 6A and 6B, a second semiconductor structure including an array of 3D NAND memory strings and a second bonding layer including a plurality of second bonding contacts is formed. As depicted in FIGS. 7A and 7B, the first semiconductor structure and the second semiconductor structure are bonded in a face-to-face manner, such that the first bonding contacts are in contact with the second bonding contacts at a bonding interface.

Referring to FIG. 11A, method 1100 starts at operation 1102, in which the one or more processors and the array of embedded DRAM cells are formed on a first substrate. The first substrate can be a silicon substrate. In some embodiments, to form the processors and the array of embedded DRAM cells, a plurality of transistors are formed on the first substrate, and a plurality of capacitors are formed above and in contact with some of the transistors. In some embodiments, one or more controllers are formed on the first substrate. In some embodiments, a peripheral circuit of the array of NAND memory cells is formed on the first substrate.

As illustrated in FIG. 5A, a plurality of transistors (e.g., logic transistors 504 and DRAM selection transistors 506) are formed on a silicon substrate 502. Transistors 504 and 506 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 502 by ion implantation and/or thermal diffusion, which function, for example, as source regions and/or drain regions of transistors 504 and 506. In some embodiments, isolation regions (e.g., STIs) are also formed in silicon substrate 502 by wet/dry etch and thin film deposition.

As illustrated in FIG. 5B, a plurality of capacitors 508 are formed above and in contact with DRAM selection transistors 506. Each capacitor 508 can be patterned by photography to be aligned with respective DRAM selection transistor 506 to form a 1T1C memory cell, for example, by electrically connecting one electrode of capacitor 508 with one node of respective DRAM selection transistor 506. In some embodiments, bit lines 507 and common plates 509 are formed as well for electrically connecting DRAM selection transistors 506 and capacitors 508. Capacitors 508 can be formed by a plurality of processes including, but not limited to, photolithography, dry/wet etch, thin film deposition, thermal growth, implantation, CMP, and any other suitable processes. A device layer 510 including one or more processors (having logic transistors 504) and an array of embedded DRAM cells (each having DRAM selection transistor 506 and capacitor 508) is thereby formed. In some embodiments, device layer 510 further includes one or more controllers and/or a peripheral circuit of the array of NAND memory cells formed by logic transistors 504 as well.

Method 1100 proceeds to operation 1104, as illustrated in FIG. 11A, in which a first interconnect layer is formed above the processors and the array of embedded DRAM cells. The first interconnect layer can include a first plurality of interconnects in one or more ILD layers. As illustrated in FIG. 5C, an interconnect layer 512 can be formed above device layer 510 including the processors (having logic transistors 504) and the array of embedded DRAM cells (each having DRAM selection transistor 506 and capacitor 508). Interconnect layer 512 can include interconnects of MEOL and/or BEOL in a plurality of ILD layers to make electrical connections with device layer 510. In some embodiments, interconnect layer 512 includes multiple ILD layers and interconnects therein formed in multiple processes. For example, the interconnects in interconnect layers 512 can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 5C can be collectively referred to as interconnect layer 512.

Method 1100 proceeds to operation 1106, as illustrated in FIG. 11, in which a first bonding layer is formed above the first interconnect layer. The first bonding layer can include a plurality of first bonding contacts. As illustrated in FIG. 5C, a bonding layer 514 is formed above interconnect layer 512. Bonding layer 514 can include a plurality of bonding contacts 516 surrounded by dielectrics. In some embodiments, a dielectric layer is deposited on the top surface of interconnect layer 512 by one or more thin film deposition processes including, but not limited to, CVD, PVD, ALD, or any combination thereof. Bonding contacts 516 then can be formed through the dielectric layer and in contact with the interconnects in interconnect layer 512 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1100 proceeds to operation 1108, as illustrated in FIG. 11A, in which a memory stack is formed above a second substrate. The second substrate can be a silicon substrate. As illustrated in FIG. 6A, interleaved sacrificial layers (not shown) and dielectric layers 608 are formed above a silicon substrate 602. The interleaved sacrificial layers and dielectric layers 608 can form a dielectric stack (not shown). In some embodiments, each sacrificial layer includes a layer of silicon nitride, and each dielectric layer 608 includes a layer of silicon oxide. The interleaved sacrificial layers and dielectric layers 608 can be formed by one or more thin film deposition processes including, but not limited to, CVD, PVD, ALD, or any combination thereof. In some embodiments, a memory stack 604 can be formed by a gate replacement process, e.g., replacing the sacrificial layers with conductor layers 606 using wet/dry etch of the sacrificial layers selective to dielectric layers 608 and filling the resulting recesses with conductor layers 606. As a result, memory stack 604 can include interleaved conductor layers 606 and dielectric layers 608. In some embodiments, each conductor layer 606 includes a metal layer, such as a layer of tungsten. It is understood that memory stack 604 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 604 and silicon substrate 602.

Method 1100 proceeds to operation 1110, as illustrated in FIG. 11A, in which the array of 3D NAND memory strings extending vertically through the memory stack are formed. As illustrated in FIG. 6A, 3D NAND memory strings 610 are formed above silicon substrate 602, each of which extends vertically through interleaved conductor layers 606 and dielectric layers 608 of memory stack 604. In some embodiments, fabrication processes to form 3D NAND memory string 610 include forming a channel hole through memory stack 604 and into silicon substrate 602 using dry etching/and or wet etching, such as deep reactive-ion etching (DRIE), followed by epitaxially growing a plug 612 in the lower portion of the channel hole from silicon substrate 602. In some embodiments, fabrication processes to form 3D NAND memory string 610 also include subsequently filling the channel hole with a plurality of layers, such as a memory film 614 (e.g., a tunneling layer, a storage layer, and a blocking layer) and a semiconductor layer 616, using thin film deposition processes such as ALD, CVD, PVD, or any combination thereof. In some embodiments, fabrication processes to form 3D NAND memory string 610 further include forming another plug 618 in the upper portion of the channel hole by etching a recess at the upper end of 3D NAND memory string 610, followed by filling the recess with a semiconductor material using thin film deposition processes such as ALD, CVD, PVD, or any combination thereof.

Method 1100 proceeds to operation 1112, as illustrated in FIG. 11A, in which a second interconnect layer is formed above the array of 3D NAND memory strings. The second interconnect layer can include a second plurality of interconnects in one or more ILD layers. As illustrated in FIG. 6B, an interconnect layer 620 can be formed above memory stack 604 and array of 3D NAND memory strings 610. Interconnect layer 620 can include interconnects of MEOL and/or BEOL in a plurality of ILD layers to make electrical connections with 3D NAND memory strings 610. In some embodiments, interconnect layer 620 includes multiple ILD layers and interconnects therein formed in multiple processes. For example, the interconnects in interconnect layers 620 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 6B can be collectively referred to as interconnect layer 620.

Method 1100 proceeds to operation 1114, as illustrated in FIG. 11A, in which a second bonding layer is formed above the second interconnect layer. The second bonding layer can include a plurality of second bonding contacts. As illustrated in FIG. 6B, a bonding layer 622 is formed above interconnect layer 620. Bonding layer 622 can include a plurality of bonding contacts 624 surrounded by dielectrics. In some embodiments, a dielectric layer is deposited on the top surface of interconnect layer 620 by one or more thin film deposition processes including, but not limited to, CVD, PVD, ALD, or any combination thereof. Bonding contacts 624 then can be formed through the dielectric layer and in contact with the interconnects in interconnect layer 620 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1100 proceeds to operation 1116, as illustrated in FIG. 11A, in which the first substrate and the second substrate are bonded in a face-to-face manner, such that the first bonding contacts are in contact with the second bonding contacts at the bonding interface. The bonding can be hybrid bonding. In some embodiments, the first substrate on which the processors and embedded DRAM cells are formed (e.g., the first semiconductor structure) is disposed above the second substrate on which the 3D NAND memory strings are formed (e.g., the second semiconductor structure) after the bonding. In some embodiments, the second substrate on which the 3D NAND memory strings are formed (e.g., the second semiconductor structure) is disposed above the first substrate on which the processors and embedded DRAM cells are formed (e.g., the first semiconductor structure) after the bonding.

As illustrated in FIG. 7A, silicon substrate 602 and components formed thereon (e.g., 3D NAND memory strings 610) are flipped upside down. Bonding layer 622 facing down is bonded with bonding layer 514 facing up, i.e., in a face-to-face manner, thereby forming a bonding interface 702 (as shown in FIG. 7B). In some embodiments, a treatment process, e.g., a plasma treatment, a wet treatment, and/or a thermal treatment, is applied to the bonding surfaces prior to the bonding. Although not shown in FIG. 7A, silicon substrate 502 and components formed thereon (e.g., device layer 510) can be flipped upside down, and bonding layer 514 facing down can be bonded with bonding layer 622 facing up, i.e., in a face-to-face manner, thereby forming bonding interface 702. After the bonding, bonding contacts 624 in bonding layer 622 and bonding contacts 516 in bonding layer 514 are aligned and in contact with one another, such that device layer 510 (e.g., the processors and embedded DRAM cells therein) can be electrically connected to 3D NAND memory strings 610. It is understood that in the bonded chip, 3D NAND memory strings 610 may be either above or below device layer 510 (e.g., the processors and embedded DRAM cells therein). Nevertheless, bonding interface 702 can be formed between 3D NAND memory strings 610 and device layer 510 (e.g., the processors and embedded DRAM cells therein) after the bonding as illustrated in FIG. 7B.

Method 1100 proceeds to operation 1118, as illustrated in FIG. 11A, in which the first substrate or the second substrate is thinned to form a semiconductor layer. In some embodiments, the first substrate of the first semiconductor structure, which is above the second substrate of the second semiconductor structure after the bonding, is thinned to form the semiconductor layer. In some embodiments, the second substrate of the second semiconductor structure, which is above the first substrate of the first semiconductor structure after the bonding, is thinned to form the semiconductor layer.

As illustrated in FIG. 7B, the substrate at the top of the bonded chip (e.g., silicon substrate 602 as shown in FIG. 7A) is thinned, so that the thinned top substrate can serve as a semiconductor layer 704, for example, a single-crystal silicon layer. The thickness of the thinned substrate can be between about 200 nm and about 5 µm, such as between 200 nm and 5 µm, or between about 150 nm and about 50 µm, such as between 150 nm and 50 µm. Silicon substrate 602 can be thinned by processes including, but not limited to, wafer grinding, dry etch, wet etch, CMP, any other suitable processes, or any combination thereof. It is understood that when silicon substrate 502 is the substrate at the top of the bonded chip, another semiconductor layer may be formed by thinning silicon substrate 502.

Method 1100 proceeds to operation 1120, as illustrated in FIG. 11A, in which a pad-out interconnect layer is formed above the semiconductor layer. As illustrated in FIG. 7B, a pad-out interconnect layer 706 is formed above semiconductor layer 704 (the thinned top substrate). Pad-out interconnect layer 706 can include interconnects, such as pad contacts 708, formed in one or more ILD layers. Pad contacts 708 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 710 are formed extending vertically through semiconductor layer 704, for example by wet/dry etch followed by depositing conductive materials. Contacts 710 can be in contact with the interconnects in pad-out interconnect layer 706.

Figure 6C:
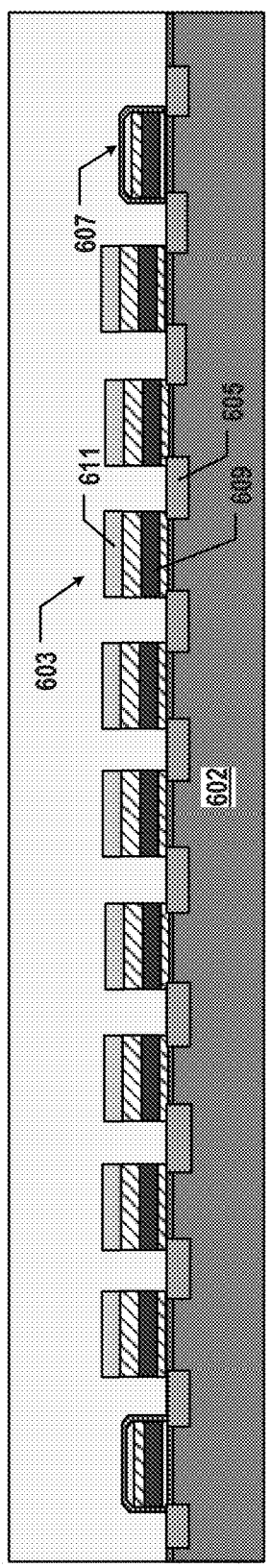
FIGS. 6C and 6D illustrate a fabrication process for forming an exemplary semiconductor structure having 2D NAND memory cells, according to some embodiments.
Figure 6D:
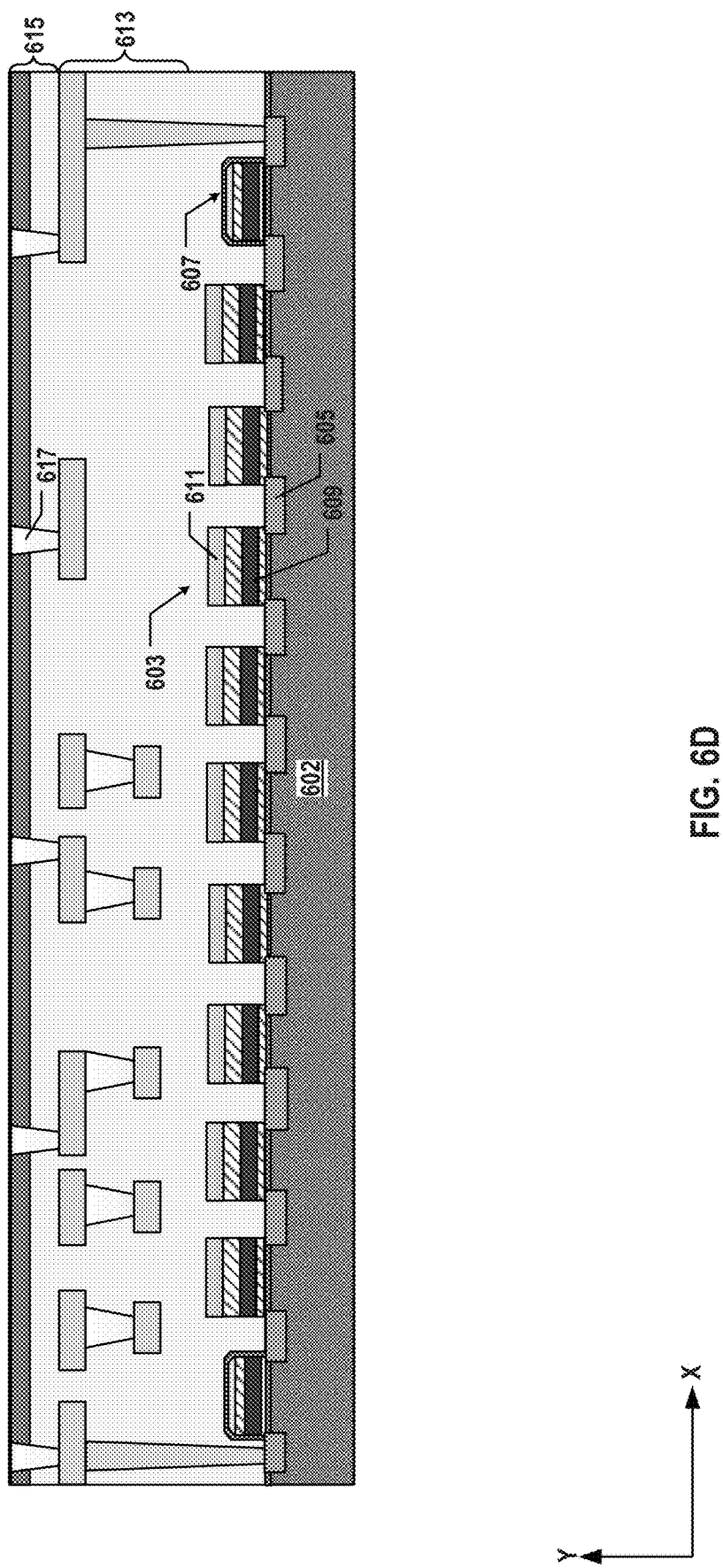
Figure 7C:
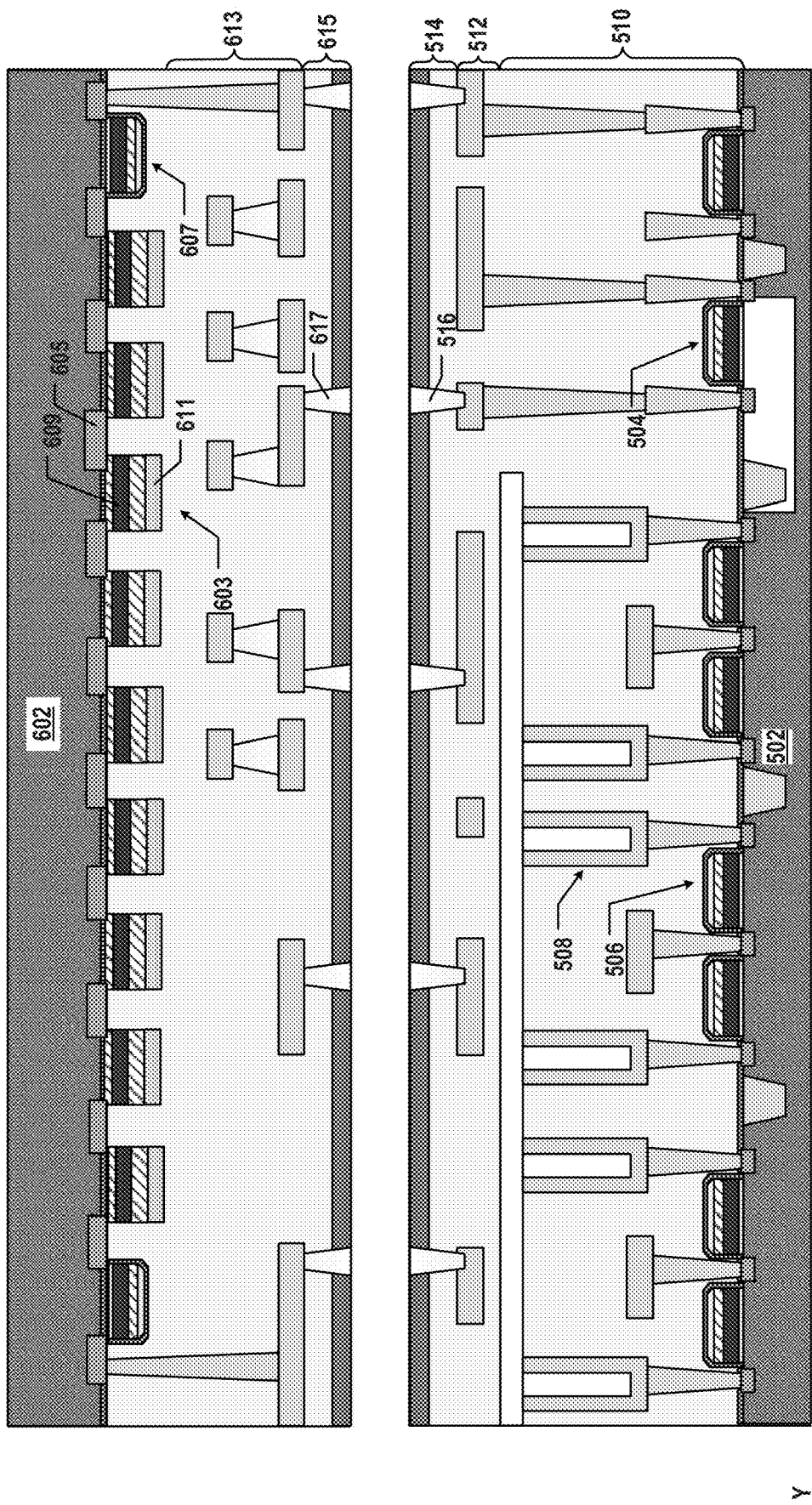
FIGS. 7C and 7D illustrate a fabrication process for forming another exemplary unified semiconductor chip, according to some embodiments.
Figure 7D:
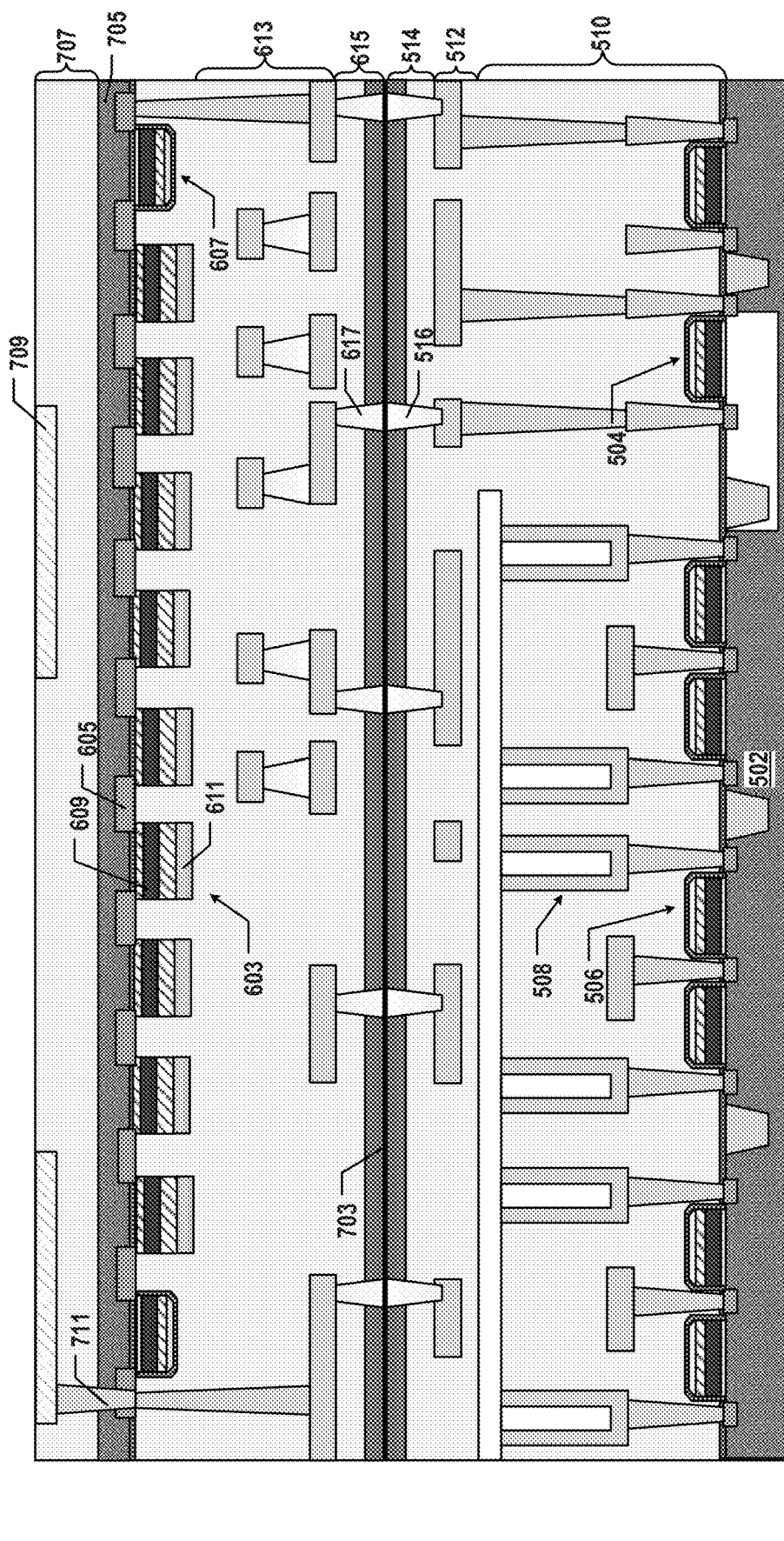
Figure 11B:
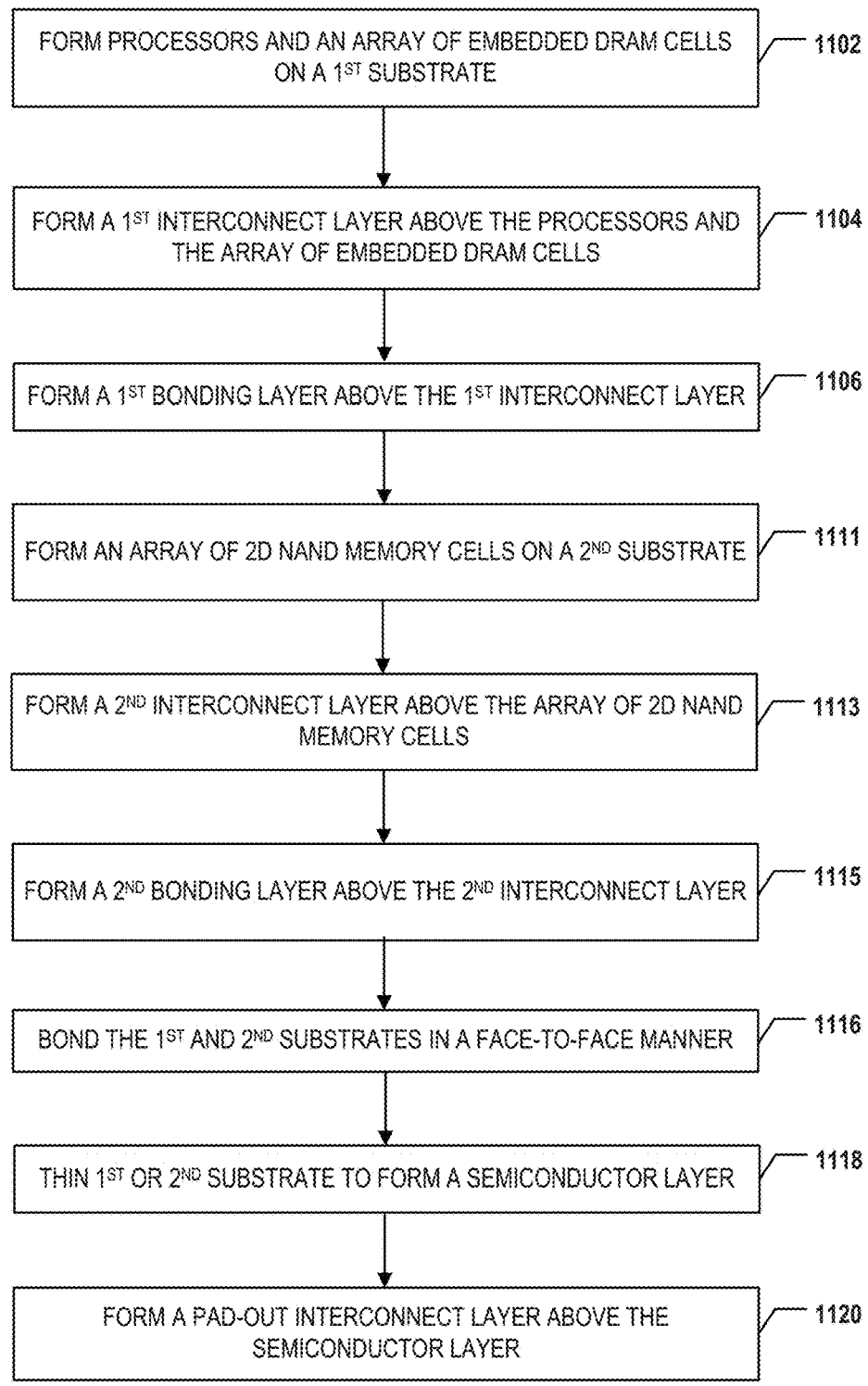
FIG. 11B is a flowchart of another exemplary method for forming a unified semiconductor chip, according to some embodiments.

As described above, 2D NAND memory cells, instead of 3D NAND memory strings, may be formed on a separate substrate and bonded into the unified semiconductor chip. FIGS. 6C and 6D illustrate a fabrication process for forming an exemplary semiconductor structure having 2D NAND memory cells, according to some embodiments. FIGS. 7C and 7D illustrate a fabrication process for forming another exemplary unified semiconductor chip, according to some embodiments. FIG. 11B is a flowchart of another exemplary method 1101 for forming a unified semiconductor chip, according to some embodiments. Examples of the unified semiconductor chip depicted in FIGS. 6C, 6D, 7C, 7D, and 11B include unified semiconductor chip 301 depicted in FIG. 3B and unified semiconductor chip 401 depicted in FIG. 4B. FIGS. 6C, 6D, 7C, 7D, and 11B will be described together. It is understood that the operations shown in method 1101 are not exhaustive and that other operations can be performed as well before, after, or between any of the illustrated operations. Further, some of the operations may be performed simultaneously, or in a different order than shown in FIG. 11B.

Operations 1102, 1104, and 1106 of method 1101 in FIG. 11B are described above with respect to method 1100 in FIG. 11A and thus, are not repeated. Method 1101 proceeds to operation 1111, as illustrated in FIG. 11B, in which an array of 2D NAND memory cells are formed on a second substrate. As illustrated in FIG. 6C, 2D NAND memory cells 603 are formed on silicon substrate 602 in the form of 2D NAND memory strings, each of which includes a plurality of memory cells connected in series by sources/drains 605 (resembling a NAND gate) and two select transistors 607 at the ends of the 2D NAND memory string, respectively. Memory cells 603 and select transistors 607 can be formed by a plurality of processes including, but not limited to, photolithography, dry/wet etch, thin film deposition, thermal growth, implantation, CMP, and any other suitable processes. In some embodiments, doped regions are formed in silicon substrate 602 by ion implantation and/or thermal diffusion, which function, for example, as sources/drains 605. In some embodiments, isolation regions (e.g., STIs, not shown) are also formed in silicon substrate 602 by wet/dry etch and thin film deposition.

In some embodiments, a gate stack is formed for each 2D NAND memory cell 603. The gate stack can include a tunneling layer, a floating gate 609, a blocking layer, and a control gate 611 from bottom to top in this order for "floating gate" type of 2D NAND memory cells 603. In some embodiments, floating gate 609 is replaced by a storage layer for "charge trap" type of 2D NAND memory cells. The tunneling layer, floating gate 609 (or storage layer), blocking layer, and control gate 611 of the gate stack can be formed by one or more thin film deposition processes including, but not limited to, CVD, PVD, ALD, electroplating, electroless plating, or any combination thereof.

Method 1100 proceeds to operation 1113, as illustrated in FIG. 11B, in which a second interconnect layer is formed above the array of 2D NAND memory cells. The second interconnect layer can include a second plurality of interconnects in one or more ILD layers. As illustrated in FIG. 6D, an interconnect layer 613 can be formed above array of 2D NAND memory cells 603. Interconnect layer 613 can include interconnects of MEOL and/or BEOL in a plurality of ILD layers to make electrical connections with 2D NAND memory cells 603. In some embodiments, interconnect layer 613 includes multiple ILD layers and interconnects therein formed in multiple processes. For example, the interconnects in interconnect layers 613 can include conductive materials deposited by one or more thin film deposition processes including, but not limited to, CVD, PVD, ALD, electroplating, electroless plating, or any combination thereof. The ILD layers can include dielectric materials deposited by one or more thin film deposition processes including, but not limited to, CVD, PVD, ALD, or any combination thereof. The ILD layers and interconnects illustrated in FIG. 6D can be collectively referred to as interconnect layer 613.

Method 1100 proceeds to operation 1115, as illustrated in FIG. 11B, in which a second bonding layer is formed above the second interconnect layer. The second bonding layer can include a plurality of second bonding contacts. As illustrated in FIG. 6D, a bonding layer 615 is formed above interconnect layer 613. Bonding layer 615 can include a plurality of bonding contacts 617 surrounded by dielectrics. In some embodiments, a dielectric layer is deposited on the top surface of interconnect layer 613 by one or more thin film deposition processes including, but not limited to, CVD, PVD, ALD, or any combination thereof. Bonding contacts 617 then can be formed through the dielectric layer and in contact with the interconnects in interconnect layer 613 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion layer, a barrier layer, and/or a seed layer before depositing the conductor.

Operations 1116, 1118, and 1120 of method 1101 in FIG. 11B are described above with respect to method 1100 in FIG. 11A and thus, are not repeated. As illustrated in FIG. 7C, silicon substrate 602 and components formed thereon (e.g., 2D NAND memory cells 603) are flipped upside down. Bonding layer 615 facing down is bonded with bonding layer 514 facing up, i.e., in a face-to-face manner, thereby forming a bonding interface 703 (as shown in FIG. 7D). Although not shown in FIG. 7C, silicon substrate 502 and components formed thereon (e.g., device layer 510) can be flipped upside down, and bonding layer 514 facing down can be bonded with bonding layer 615 facing up, i.e., in a face-to-face manner, thereby forming bonding interface 702. After the bonding, bonding contacts 617 in bonding layer 615 and bonding contacts 516 in bonding layer 514 are aligned and in contact with one another, such that device layer 510 (e.g., the processors and embedded DRAM cells therein) can be electrically connected to 2D NAND memory cells 603. It is understood that in the bonded chip, 2D NAND memory cells 603 may be either above or below device layer 510 (e.g., the processors and embedded DRAM cells therein).

As illustrated in FIG. 7D, the substrate at the top of the bonded chip (e.g., silicon substrate 602 as shown in FIG. 7C) is thinned, so that the thinned top substrate can serve as a semiconductor layer 705, for example, a single-crystal silicon layer. Silicon substrate 602 can be thinned by processes including, but not limited to, wafer grinding, dry etch, wet etch, CMP, any other suitable processes, or any combination thereof. It is understood that when silicon substrate 502 is the substrate at the top of the bonded chip, another semiconductor layer may be formed by thinning silicon substrate 502. As illustrated in FIG. 7D, a pad-out interconnect layer 707 is formed above semiconductor layer 705 (the thinned top substrate). Pad-out interconnect layer 707 can include interconnects, such as pad contacts 709, formed in one or more ILD layers. In some embodiments, after the bonding and thinning, contacts 711 are formed extending vertically through semiconductor layer 705, for example by wet/dry etch followed by depositing conductive materials. Contacts 711 can be in contact with the interconnects in pad-out interconnect layer 707.

Figure 8:
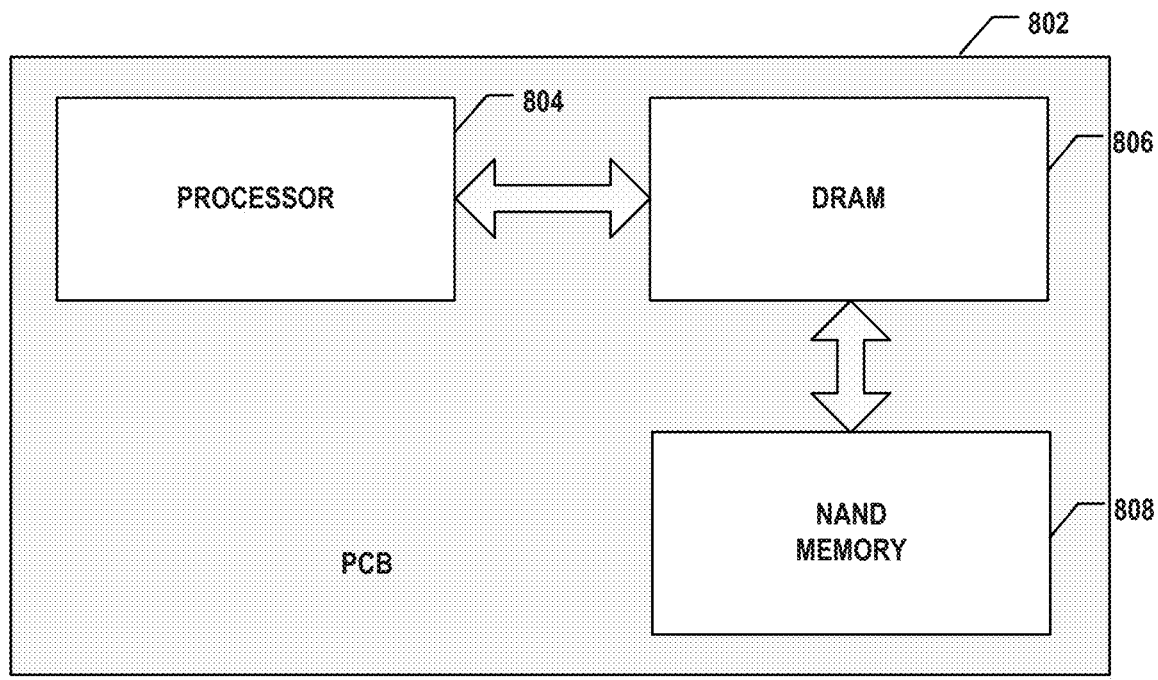
FIG. 8 illustrates a schematic diagram of discrete processor, DRAM, and NAND memory on a printed circuit board (PCB) and operations thereof.

As described above, in existing mobile devices, processing units (e.g., various processors and controllers) and memory (e.g., DRAM and NAND memory) are placed on the PCB as discrete chips, which communicate with each other through relatively long and slow interlinks (e.g., various data buses) on the PCB, thereby suffering from relatively low data throughput. Moreover, the large number of discrete chips occupy large PCB area, limiting the further reduction of the mobile device size and the equipment of a larger battery for longer battery life. For example, FIG. 8 illustrates a schematic diagram of discrete processor 804, DRAM 806, and NAND memory 808 on a PCB 802 and operations thereof. Each one of processor 804, DRAM 806, and NAND memory 808 is a discrete chip with its own package and mounted on PCB 802. Processor 804 is an application processor or a baseband processor. Data is transmitted between processor 804 and DRAM 806 through an interlink, such as a memory bus. NAND memory 808 is a 3D NAND memory or a 2D NAND memory, which transfers data with DRAM 806 through another interlink, such as a peripheral component interconnect express (PCIe) bus or a serial at attachment (SATA) bus. Due to the relatively low data throughput between processor 804 and memory 806 and 808, processor 804 also includes on-chip memory (e.g., cache) as a high-speed buffer for fast access, which further increases the PCB footprint of processor 804.

Figure 9:
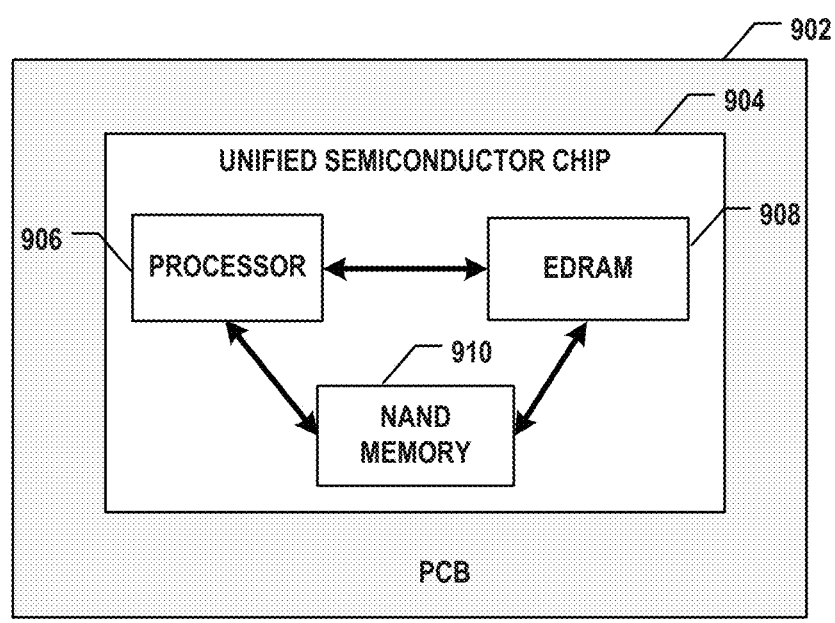
FIG. 9 illustrates a schematic diagram of an exemplary unified semiconductor chip on a PCB and operations thereof, according to some embodiments.
Figure 12:
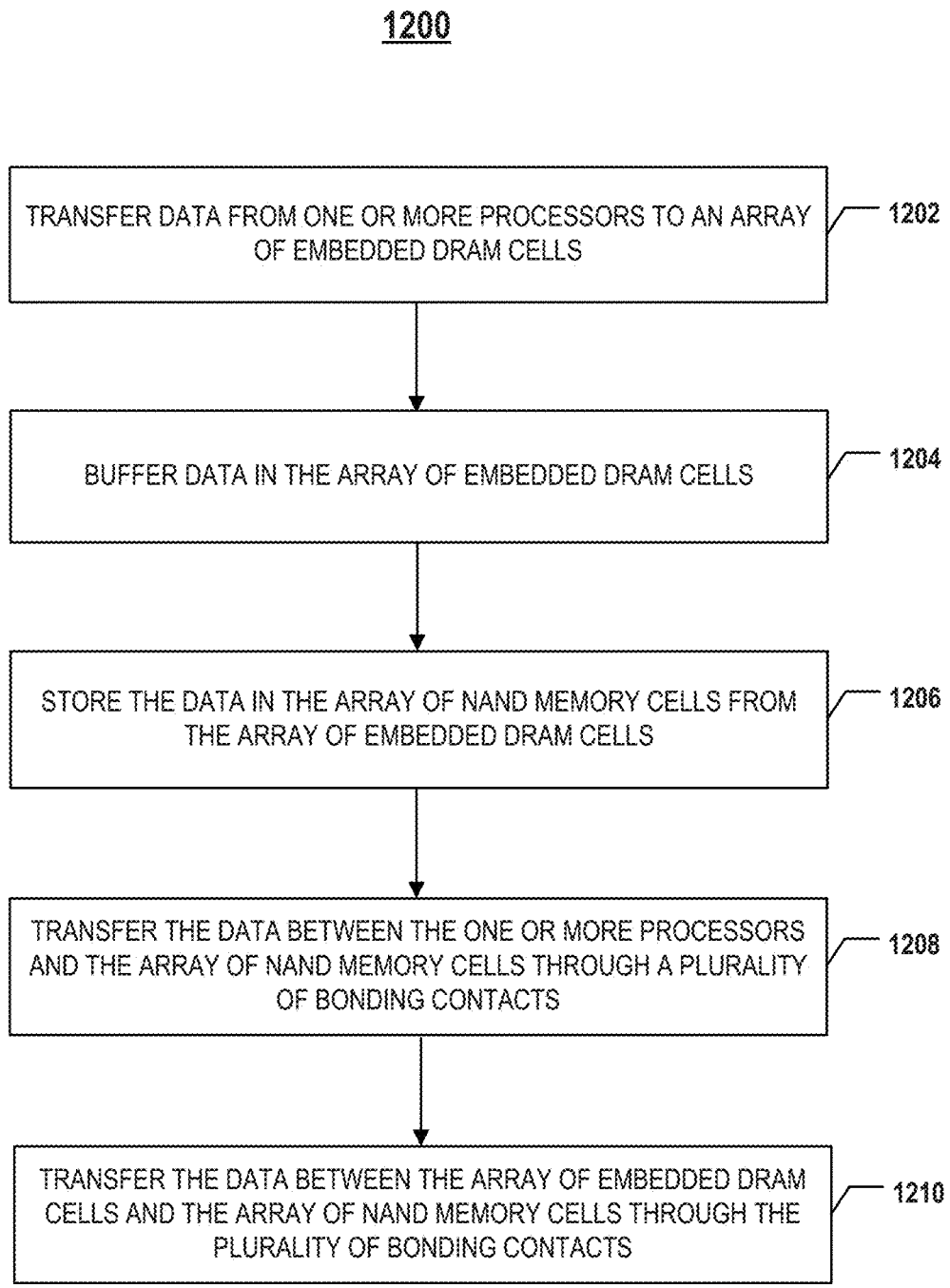
FIG. 12 is a flowchart of an exemplary method for operating a unified semiconductor chip, according to some embodiments.

FIG. 9 illustrates a schematic diagram of an exemplary unified semiconductor chip 904 on a PCB 902 and operations thereof, according to some embodiments. FIG. 12 is a flowchart of an exemplary method 1200 for operating a unified semiconductor chip, according to some embodiments. Examples of the unified semiconductor chip depicted in FIG. 12 include unified semiconductor chip 904 depicted in FIG. 9. FIGS. 9 and 12 will be described together. It is understood that the operations shown in method 1200 are not exhaustive and that other operations can be performed as well before, after, or between any of the illustrated operations. Further, some of the operations may be performed simultaneously, or in a different order than shown in FIG. 12. As illustrated in FIG. 9, unified semiconductor chip 904 includes a processor 906, embedded DRAM 908 having an array of embedded DRAM cells, and NAND memory 910 having an array of NAND memory cells. Processor 906, embedded DRAM 908, and NAND memory 910 (either a 3D NAND memory or a 2D NAND memory) can be formed in the same bonded chip as described above in detail, such as unified semiconductor chips 100, 101, 300, 301, 400, and 401.

Referring to FIG. 12, method 1200 starts at operation 1202, in which data is transferred from one or more processors to an array of embedded DRAM cells. As illustrated in FIG. 9, any suitable type of data generated by processor 906 can be transferred to embedded DRAM 908 of unified semiconductor chip 904, for example, display data generated by a GPU in an application processor to be presented by the display or data generated by a modem in a baseband application to be transmitted by the cellular transceiver.

Method 1200 proceeds to operation 1204, as illustrated in FIG. 12, in which the data is buffered in the array of embedded DRAM cells. As illustrated in FIG. 9, embedded DRAM 908 can work as an integrated high-speed, on-chip buffer of unified semiconductor chip 904 for buffering the data transferred from processor 906.

Method 1200 proceeds to operation 1206, as illustrated in FIG. 12, in which the data is stored in the array of NAND memory cells from the array of embedded DRAM cells. As illustrated in FIG. 9, the data buffered in embedded DRAM 908 can be stored in NAND memory 910. In some embodiments, bidirectional, direct data transfer between processor 906 and NAND memory 910 becomes available, such that the data can be buffered in embedded DRAM 908 and stored in NAND memory 910 in parallel.

Method 1200 proceeds to operation 1208, as illustrated in FIG. 12, in which the data is transferred between the one or more processors and the array of NAND memory cells through a plurality of bonding contacts. For example, data can be bidirectionally transferred between processor 906 and NAND memory 910 through direct electrical connections by a plurality of bonding contacts (e.g., over millions of bonding contacts in parallel) as described above in detail, which have shortened distance, higher throughput, and lower power consumption compared with the conventional on-board chip-to-chip data bus, for example, shown in FIG. 8.

Method 1200 proceeds to operation 1210, as illustrated in FIG. 12, in which the data is transferred between the array of embedded DRAM cells and the array of NAND memory cells through the plurality of bonding contacts. For example, data can be bidirectionally transferred between embedded DRAM 908 and NAND memory 910 through direct electrical connections by a plurality of bonding contacts (e.g., over millions of bonding contacts in parallel) as described above in detail, which have shortened distance, higher throughput, and lower power consumption compared with the conventional on-board chip-to-chip data bus, for example, shown in FIG. 8.

Embedded DRAM 908 along with direct electrical connections can work as the high-speed memory buffer to eliminate the need for on-chip memory, thereby reducing chip size and enable additional features, such as an instant-on feature. In some embodiments, the transferring of data between embedded DRAM 908 and NAND memory 910 is triggered in response to power on or power off of unified semiconductor device 904. For example, an instant-on feature of unified semiconductor chip 904 can be enabled by the data transferred between embedded DRAM 908 and NAND memory 910. In some embodiments, in response to power off of unified semiconductor chip 904, a snapshot of user data and/or operation system data buffered in embedded DRAM 908 is immediately transferred to NAND memory 910, which can be retained after power off. In response to power on of unified semiconductor chip 904, the snapshot of user data and/or operation system data stored in NAND memory 910 can be immediately transferred back to embedded DRAM 908 to restore the last state of unified semiconductor chip 904 prior to the power-off.

Figure 10:
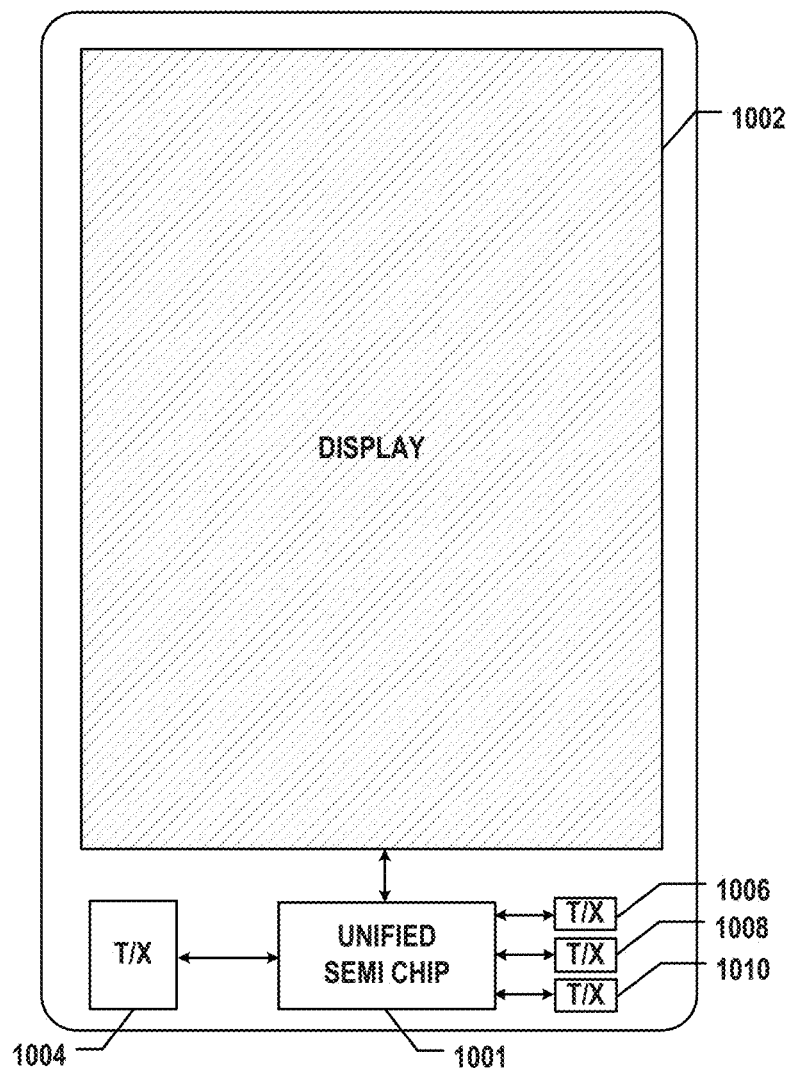
FIG. 10 illustrates a schematic diagram of an exemplary mobile device having a unified semiconductor chip, according to some embodiments.

FIG. 10 illustrates a schematic diagram of an exemplary mobile device 1000 having a unified semiconductor chip 1001, according to some embodiments. Mobile device 1000 can be any portable or handheld computing devices including, but not limited to VR/AR headsets, smartphones, tablets, eyeglasses, wrist watches, portable gaming consoles, laptop computers, etc. Mobile device 1000 includes a display 1002 and a plurality of transceivers including a cellular transceiver 1004 for cellular communication, a Bluetooth transceiver 1006 for Bluetooth communication, a Wi-Fi transceiver 1008 for Wi-Fi communication, and a GPS transceiver 1010 for positioning and navigation. Display 1002 may be an organic light emitting diode (OLED) display, a micro-LED display, a liquid crystal display (LCD), an E-ink display, an electroluminescent display (ELD), or any other suitable type of display. It is understood that mobile device 1000 may include additional components that are not shown in FIG. 10, such as a battery, a camera, various sensors, to name a few.

Unified semiconductor chip 1001 can be any unified semiconductor chips disclosed herein (e.g., unified semiconductor chips 100, 101, 300, 301, 400, 401, and 904) operatively coupled to display 1002 and transceivers 1004, 1006, 1008, and 1010 through any suitable interfaces and interlinks. As described above in detail, unified semiconductor chip 1001 can be a single chip that includes two semiconductor structures (not shown) bonded together. In some embodiments, a first semiconductor structure includes an application processor, a baseband processor, an array of embedded DRAM cells, and a first bonding layer including first bonding contacts, and a second semiconductor structure includes an array of NAND memory cells and a second bonding layer including second bonding contacts. A bonding interface exists between the first bonding layer and the second bonding layer at which the first bonding contacts are in contact with the second bonding contacts, according to some embodiments.

In some embodiments, the application processor in unified semiconductor chip 1001 is configured to generate data to be presented by display 1002, and the baseband processor is configured to process data received by cellular transceiver 1004 and data to be transmitted by cellular transceiver 1004. The data transferred between the application processor and display 1002 or between the baseband processor and cellular transceiver 1004 is buffered in the array of embedded DRAM cells, according to some embodiments. As a result, in some embodiments, the application processor is free of on-chip memory. In some embodiments, the application processor in unified semiconductor chip 1001 is further configured to transfer data from or to the array of NAND memory cells through the first and the second bonding contacts.

The first semiconductor structure of unified semiconductor chip 1001 can further include various controllers (not shown) including a display controller, a GPS controller, and communication controllers, such as a Bluetooth controller and a Wi-Fi controller. In some embodiments, the display controller is configured to control the operation of display 1002. In some embodiments, the Bluetooth controller is configured to control the operation of Bluetooth transceiver 1006, and the Wi-Fi controller is configured to control the operation of Wi-Fi transceiver 1008. In some embodiments, the GPS controller is configured to control the operation of GPS transceiver 1010.

According to one aspect of the present disclosure, a unified semiconductor chip includes a first semiconductor structure including one or more processors, an array of embedded DRAM cells, and a first bonding layer including a plurality of first bonding contacts. The unified semiconductor chip also includes a second semiconductor structure including an array of NAND memory cells and a second bonding layer including a plurality of second bonding contacts. The unified semiconductor chip further includes a bonding interface between the first bonding layer and the second bonding layer. The first bonding contacts are in contact with the second bonding contacts at the bonding interface.

In some embodiments, the first semiconductor structure includes a substrate, the one or more processors on the substrate, the array of embedded DRAM cells on the substrate and outside of the one or more processors, and the first bonding layer above the one or more processors and the array of embedded DRAM cells.

In some embodiments, the second semiconductor structure includes the second bonding layer above the first bonding layer, a memory stack above the second bonding layer, an array of 3D NAND memory strings extending vertically through the memory stack, and a semiconductor layer above and in contact with the array of 3D NAND memory strings.

In some embodiments, the second semiconductor structure includes the second bonding layer above the first bonding layer, an array of 2D NAND memory cells above the second bonding layer, and a semiconductor layer above and in contact with the array of 2D NAND memory cells.

In some embodiments, the unified semiconductor chip further includes a pad-out interconnect layer above the semiconductor layer. In some embodiments, the semiconductor layer includes polysilicon. In some embodiments, the semiconductor layer includes single-crystal silicon.

In some embodiments, the second semiconductor structure includes a substrate, a memory stack above the substrate, an array of 3D NAND memory strings extending vertically through the memory stack, and the second bonding layer above the memory stack and the array of 3D NAND memory strings.

In some embodiments, the second semiconductor structure includes a substrate, an array of 2D NAND memory cells on the substrate, and the second bonding layer above the memory stack and the array of 2D NAND memory cells.

In some embodiments, the first semiconductor structure includes the first bonding layer above the second bonding layer, the one or more processors above the first bonding layer, the array of embedded DRAM cells above the first bonding layer and outside of the one or more processors, and a semiconductor layer above and in contact with the one or more processors and the array of embedded DRAM cells. In some embodiments, the unified semiconductor chip further includes a pad-out interconnect layer above the semiconductor layer.

In some embodiments, the one or more processors and the array of embedded DRAM cells are stacked one over another.

In some embodiments, each embedded DRAM cell includes a transistor and a capacitor.

In some embodiments, the first semiconductor structure includes a first interconnect layer vertically between the first bonding layer and the one or more processors, and the second semiconductor structure includes a second interconnect layer vertically between the second bonding layer and the array of NAND memory cells.

In some embodiments, the one or more processors are electrically connected to the array of NAND memory cells through the first and second interconnect layers and the first and second bonding contacts.

In some embodiments, the array of embedded DRAM cells are electrically connected to the array of NAND memory cells through the first and second interconnect layers and the first and second bonding contacts.

In some embodiments, the one or more processors include an application processor and a baseband processor.

In some embodiments, the first semiconductor structure further comprises one or more controllers. In some embodiments, the first semiconductor structure further comprises a peripheral circuit of the array of NAND memory cells.

In some embodiments, the array of embedded DRAM cells are electrically connected to the one or more processors through the first interconnect layer.

According to another aspect of the present disclosure, a method for forming a unified semiconductor chip is disclosed. A first semiconductor structure is formed. The first semiconductor structure includes one or more processors, an array of embedded DRAM cells, and a first bonding layer including a plurality of first bonding contacts. A second semiconductor structure is formed. The second semiconductor structure includes an array of NAND memory cells and a second bonding layer including a plurality of second bonding contacts. The first semiconductor structure and the second semiconductor structure are bonded in a face-to-face manner, such that the first bonding contacts are in contact with the second bonding contacts at a bonding interface.

In some embodiments, to form the first semiconductor structure, the one or more processors and the array of embedded DRAM cells are formed on a first substrate, a first interconnect layer is formed above the one or more processors and the array of embedded DRAM cells, and the first bonding layer is formed above the first interconnect layer.

In some embodiments, to form the one or more processors and the array of embedded DRAM cells, a plurality of transistors are formed on the first substrate, and a plurality of capacitors are formed above and in contact with some of the transistors.

In some embodiments, to form the second semiconductor structure, a memory stack is formed above a second substrate, an array of 3D NAND memory strings extending vertically through the memory stack are formed, a second interconnect layer is formed above the array of 3D NAND memory strings, and the second bonding layer is formed above the second interconnect layer.

In some embodiments, to form the second semiconductor structure, an array of 2D NAND memory cells are formed on a second substrate, a second interconnect layer is formed above the array of 2D NAND memory cells, and the second bonding layer is formed above the second interconnect layer.

In some embodiments, the second semiconductor structure is above the first semiconductor structure after the bonding. In some embodiments, the second substrate is thinned to form a semiconductor layer after the bonding, and a pad-out interconnect layer is formed above the semiconductor layer.

In some embodiments, the first semiconductor structure is above the second semiconductor structure after the bonding. In some embodiments, the first substrate is thinned to form a semiconductor layer after the bonding, and a pad-out interconnect layer is formed above the semiconductor layer.

In some embodiments, the bonding includes hybrid bonding.

In some embodiments, the one or more processors include an application processor and a baseband processor.

In some embodiments, one or more controllers are formed on the first substrate. In some embodiments, a peripheral circuit of the array of NAND memory cells is formed on the first substrate.

According to still another aspect of the present disclosure, a method for operating a unified semiconductor chip is disclosed. The unified semiconductor chip includes one or more processors, an array of embedded DRAM cells, and an array of NAND memory cells in a same bonded chip. Data is transferred from the one or more processors to the array of embedded DRAM cells. The data is buffered in the array of embedded DRAM cells. The data is stored in the array of NAND memory cells from the array of embedded DRAM cells.

In some embodiments, the data is transferred between the one or more processors and the array of NAND memory cells through a plurality of bonding contacts.

In some embodiments, the data is transferred between the array of embedded DRAM cells and the array of NAND memory cells through the plurality of bonding contacts.

In some embodiments, transferring the data between the array of embedded DRAM cells and the array of NAND memory cells is triggered in response to power on or power off of the unified semiconductor chip.

In some embodiments, the application processor is free of on-chip memory.

According to yet another aspect of the present disclosure, a mobile device includes a display, one or more transceivers, and a unified semiconductor chip operatively coupled the display and the one or more transceivers. The unified semiconductor chip includes a first semiconductor structure including an application processor, a baseband processor, an array of embedded DRAM cells, and a first bonding layer including a plurality of first bonding contacts. The unified semiconductor chip also includes a second semiconductor structure including an array of NAND memory cells and a second bonding layer including a plurality of second bonding contacts. The unified semiconductor chip further includes a bonding interface between the first bonding layer and the second bonding layer. The first bonding contacts are in contact with the second bonding contacts at the bonding interface. The application processor is configured to generate data to be presented by the display. The baseband processor is configured to process data received by at least one of the one or more transceivers and data to be transmitted by the at least one transceiver.

In some embodiments, the application processor is further configured to transfer data from or to the array of NAND memory cells through the first and the second bonding contacts.

In some embodiments, the first semiconductor structure further comprises a display controller configured to control operation of the display.

In some embodiments, the first semiconductor structure further comprises a communication controller configured to control operation of at least one of the one or more transceivers. In some embodiments, the one or more transceivers comprise at least one of a Bluetooth transceiver, a Wi-Fi transceiver, or a GPS transceiver, and the communication controller comprises at least one of a Bluetooth controller, a Wi-Fi controller, or a GPS controller.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a unified semiconductor chip, comprising:
    forming a first semiconductor structure comprising one or more processors, an array of embedded dynamic random-access memory (DRAM) cells, and a first bonding layer comprising a plurality of first bonding contacts;
    forming a second semiconductor structure comprising an array of NAND memory cells and a second bonding layer comprising a plurality of second bonding contacts; and
    bonding the first semiconductor structure and the second semiconductor structure in a face-to-face manner, such that the first bonding contacts are in contact with the second bonding contacts at a bonding interface.

2. The method of claim 1, wherein forming the first semiconductor structure comprises:
    forming the one or more processors and the array of embedded DRAM cells on a first substrate;
    forming a first interconnect layer above the one or more processors and the array of embedded DRAM cells; and
    forming the first bonding layer above the first interconnect layer.

3. The method of claim 2, wherein forming the one or more processors and the array of embedded DRAM cells comprises:
    forming a plurality of transistors on the first substrate; and
    forming a plurality of capacitors above and in contact with some of the transistors.

4. The method of claim 1, wherein forming the second semiconductor structure comprises:
    forming a memory stack above a second substrate;
    forming an array of three-dimensional (3D) NAND memory strings extending vertically through the memory stack;
    forming a second interconnect layer above the array of 3D NAND memory strings; and
    forming the second bonding layer above the second interconnect layer.

5. The method of claim 1, wherein forming the second semiconductor structure comprises:
    forming an array of two-dimensional (2D) NAND memory cells on a second substrate;
    forming a second interconnect layer above the array of 2D NAND memory cells; and
    forming the second bonding layer above the second interconnect layer.

6. The method of claim 1, wherein the second semiconductor structure is above the first semiconductor structure after the bonding.

7. The method of claim 6, further comprising:
    thinning the second substrate to form a semiconductor layer after the bonding; and
    forming a pad-out interconnect layer above the semiconductor layer.

8. The method of claim 1, wherein the first semiconductor structure is above the second semiconductor structure after the bonding.

9. The method of claim 8, further comprising:
    thinning the first substrate to form a semiconductor layer after the bonding; and
    forming a pad-out interconnect layer above the semiconductor layer.

10. The method of claim 1, wherein the bonding comprises hybrid bonding.

11. The method of claim 1, wherein the one or more processors comprise an application processor and a baseband processor.

12. The method of claim 1, wherein forming the first semiconductor structure further comprises forming one or more controllers on the first substrate.

13. The method of claim 1, wherein forming the first semiconductor structure further comprises forming a peripheral circuit of the array of NAND memory cells on the first substrate.

14. A method for operating a unified semiconductor chip comprising one or more processors, an array of embedded dynamic random-access memory (DRAM) cells, and an array of NAND memory cells in a same bonded chip, the method comprising:
- transferring data from the one or more processors to the array of embedded DRAM cells;
- buffering the data in the array of embedded DRAM cells; and
- storing the data in the array of NAND memory cells from the array of embedded DRAM cells.

15. The method of claim 14, further comprising transferring the data between the one or more processors and the array of NAND memory cells through a plurality of bonding contacts.

16. The method of claim 15, further comprising transferring the data between the array of embedded DRAM cells and the array of NAND memory cells through the plurality of bonding contacts.

17. The method of claim 16, wherein transferring the data between the array of embedded DRAM cells and the array of NAND memory cells is triggered in response to power on or power off of the unified semiconductor chip.

18. A mobile device, comprising:
- a display;
- one or more transceivers; and
- a unified semiconductor chip operatively coupled the display and the one or more transceivers and comprising:
  - a first semiconductor structure comprising an application processor, a baseband processor, an array of embedded dynamic random-access memory (DRAM) cells, and a first bonding layer comprising a plurality of first bonding contacts;
  - a second semiconductor structure comprising an array of NAND memory cells and a second bonding layer comprising a plurality of second bonding contacts; and
  - a bonding interface between the first bonding layer and the second bonding layer, wherein the first bonding contacts are in contact with the second bonding contacts at the bonding interface, wherein
  - the application processor is configured to generate data to be presented by the display; and
  - the baseband processor is configured to process data received by at least one of the one or more transceivers and data to be transmitted by the at least one transceiver.

19. The mobile device of claim 18, wherein the application processor is further configured to transfer data from or to the array of NAND memory cells through the first and the second bonding contacts.

20. The mobile device of claim 18, wherein the first semiconductor structure further comprises a display controller configured to control operation of the display.

* * * * *